(12) United States Patent
Suzuki

(10) Patent No.: US 10,097,176 B2
(45) Date of Patent: Oct. 9, 2018

(54) DRIVING DEVICE FOR SWITCHING ELEMENT AND POWER CONVERSION SYSTEM

(71) Applicant: DENSO CORPORATION, Kariya, Aichi-pref. (JP)

(72) Inventor: Tomotaka Suzuki, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/071,963

(22) Filed: Mar. 16, 2016

(65) Prior Publication Data

US 2016/0276956 A1 Sep. 22, 2016

(30) Foreign Application Priority Data

Mar. 16, 2015 (JP) ................................. 2015-052629

(51) Int. Cl.
| | | |
|---|---|---|
| H02P 23/00 | (2016.01) | |
| H03K 17/56 | (2006.01) | |
| H02M 1/08 | (2006.01) | |
| H03K 17/16 | (2006.01) | |
| H02P 27/06 | (2006.01) | |
| H02M 7/5387 | (2007.01) | |
| H02M 1/00 | (2006.01) | |

(52) U.S. Cl.
CPC .............. *H03K 17/56* (2013.01); *H02M 1/08* (2013.01); *H03K 17/163* (2013.01); *H02M 7/5387* (2013.01); *H02M 2001/0029* (2013.01); *H02M 2001/0048* (2013.01); *H02P 27/06* (2013.01); *Y02B 70/1491* (2013.01)

(58) Field of Classification Search
CPC ................. H02M 7/537; H02M 1/088; H02M 2001/0009; H03K 17/56; H02P 27/06
USPC ........................................................ 318/504
See application file for complete search history.

(56) References Cited

U.S. PATENT DOCUMENTS

| | | | |
|---|---|---|---|
| 2007/0041225 A1* | 2/2007 | Fahlenkamp | H02M 3/33507 363/21.01 |
| 2012/0062190 A1* | 3/2012 | Haiplik | H02M 3/156 323/271 |
| 2012/0146613 A1 | 6/2012 | Hamanaka et al. | |

(Continued)

FOREIGN PATENT DOCUMENTS

| | | |
|---|---|---|
| JP | 2008-35068 A | 2/2008 |
| JP | 2009-213313 A | 9/2009 |
| JP | 2011-010441 A | 1/2011 |

(Continued)

*Primary Examiner* — Eduardo Colon Santana
*Assistant Examiner* — Gabriel Agared
(74) *Attorney, Agent, or Firm* — Oliff PLC

(57) ABSTRACT

In a driving device, a resistor is provided on a current path connected to an on-off control terminal of a switching element. The current path permits a drive current to flow therethrough to or from the on-off control terminal of the switching element. A switching rate setter sets a switching rate of switching the switching element from one of an on state and an off state to the other thereof. A current adjusting unit includes an open-close control element provided on the current path for electrically opening or closing the current path. The current adjusting unit is configured to adjust, according to the switching rate set by the switching rate setter, the drive current flowing through the current path and the resistor while closing the open-close control element.

16 Claims, 7 Drawing Sheets

(56) References Cited

U.S. PATENT DOCUMENTS

| | | | |
|---|---|---|---|
| 2013/0181640 A1* | 7/2013 | Fukuta | H03K 17/166 318/139 |
| 2013/0272547 A1* | 10/2013 | Waller, Jr. | H04R 3/00 381/120 |

FOREIGN PATENT DOCUMENTS

| | | |
|---|---|---|
| JP | 2012-16110 A | 1/2012 |
| JP | 2012-129973 A | 7/2012 |
| JP | 2012-130133 A | 7/2012 |
| JP | 2014-222990 A | 11/2014 |
| JP | 2014-222991 A | 11/2014 |

* cited by examiner

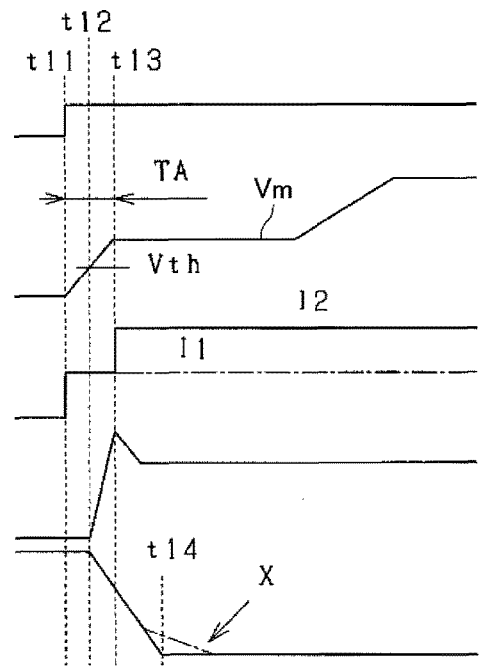
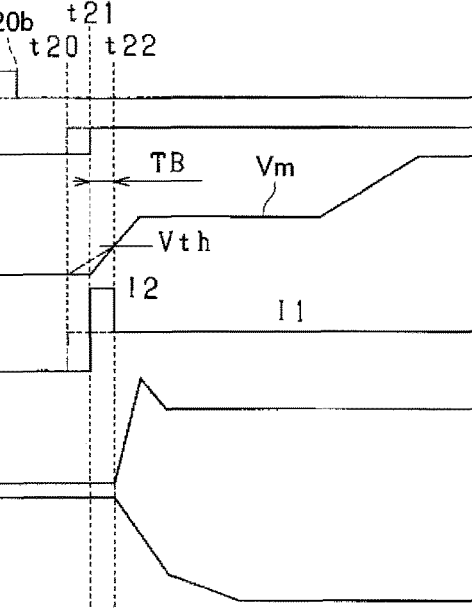

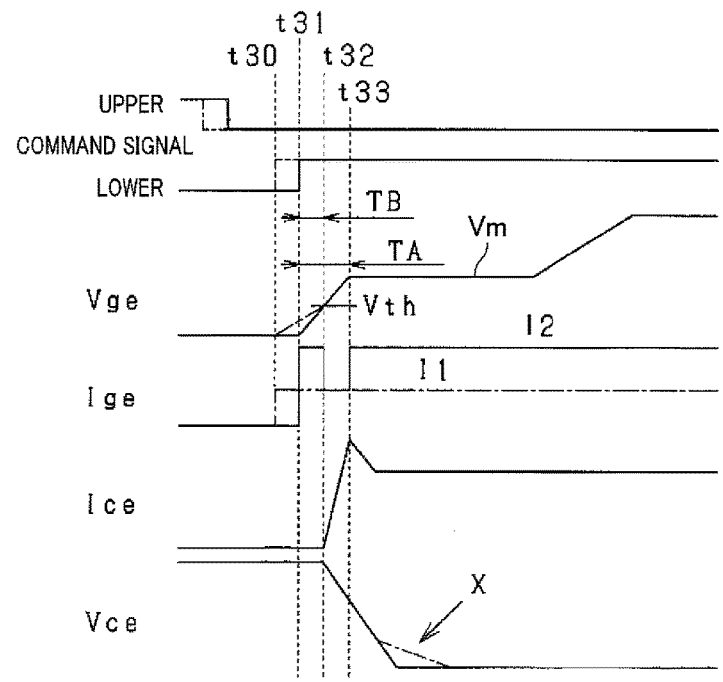
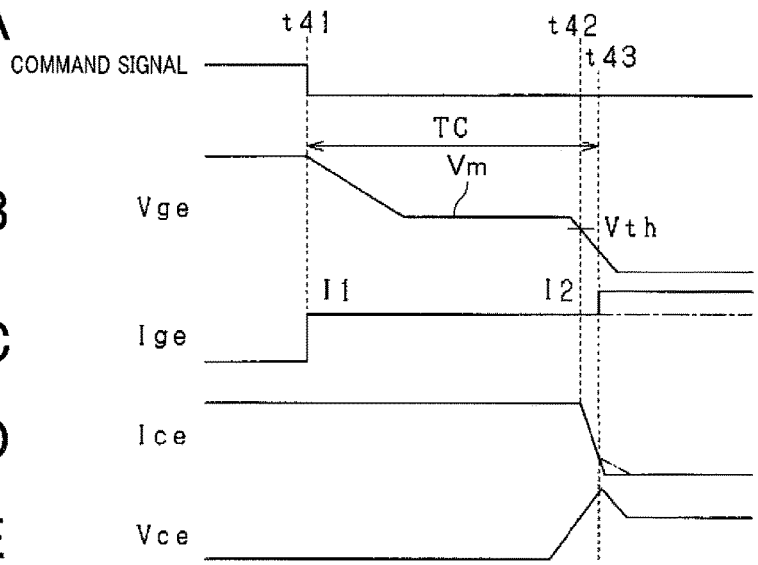

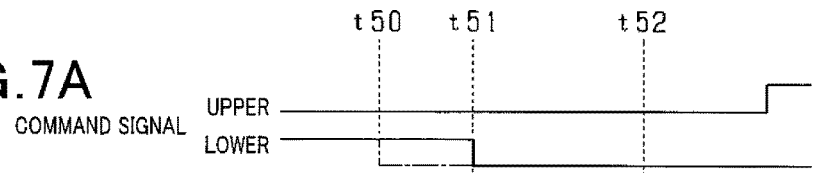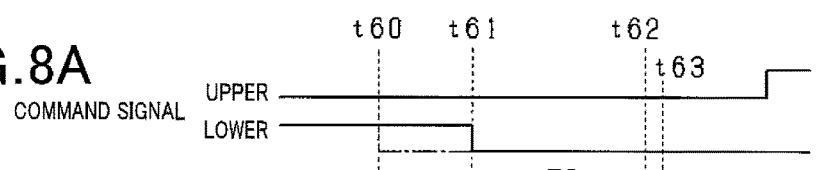

DRIVING DEVICE FOR SWITCHING ELEMENT AND POWER CONVERSION SYSTEM

CROSS REFERENCE TO RELATED APPLICATION

This application is based on and claims the benefit of priority from Japanese Patent Application No. 2015-052629 filed on Mar. 16, 2015, the disclosure of which is incorporated in its entirety herein by reference.

TECHNICAL FIELD

The present disclosure relates to driving devices for turning on or off a switching element of, for example, a power converter.

BACKGROUND

Typical power converters for performing power conversion between a direct-current (DC) voltage and an alternating-current (AC) voltage include a pair of upper- and lower-arm switching elements connected in series to each other for each phase of the AC voltage. Such a power converter alternately turns on the upper-arm switching element and the lower-arm switching element to perform power conversion between a DC voltage and an AC voltage.

On-off switching operations of a switching element of such a power converter may yield the occurrence of a surge and/or power loss. For addressing the occurrence of a surge and/or power loss, a technology has been proposed; the technology variably sets the rate of changing, i.e. switching, a switching element from one of an on state and an off state to the other thereof according to a value of at least one parameter. As the at least one parameter, a DC voltage input to the power converter can be used.

Japanese Patent Application Publication No. 2011-10441, referred to as patent document 1, discloses a driving device for a switching element as an example of the technology.

The driving device disclosed in the patent document 1 includes a plurality of current paths connected to the on-off control terminal of a switching element; the current paths respectively include resistors having different resistance values from each other. The driving device also includes a plurality of path switching elements provided on the respective current paths. Selectively turning on one of the path switching elements selects one of the current paths to be connected to the on-off control terminal of the switching element. This changes the value of a drive current flowing to or from the on-off control terminal of the switching element through the selected one of the current paths in comparison to the value of the drive current through another of the current paths. This varies the rate of switching the switching element from one of the on state and the off state to the other thereof.

SUMMARY

The driving device disclosed in, for example, the patent document 1 requires the plurality of current paths having different resistance values from each other, and the plurality of path switching elements for selecting one of the plurality of current paths. This may cause a size increase of the driving device.

A first aspect of the present disclosure in view of the above circumstances aims to provide driving devices, each of which is capable of varying the rate of switching a switching element between its switching states with a lower size. A second aspect of the present disclosure in view of the above circumstances aims to provide control systems for a power converter using such driving devices according to the first aspect of the present disclosure.

A driving device for turning on or off, in response to a command signal, a switching element having an input terminal, an output terminal, and an on-off control terminal according to a first exemplary aspect of the present disclosure includes a resistor provided on a current path connected to the on-off control terminal of the switching element. The current path permits a drive current to flow therethrough to or from the on-off control terminal of the switching element. The driving device includes a switching rate setter configured to set a switching rate of switching the switching element from one of an on state and an off state to the other thereof. The driving device includes a current adjusting unit including an open-close control element provided on the current path for electrically opening or closing the current path. The current adjusting unit is configured to adjust, according to the switching rate set by the switching rate setter, the drive current flowing through the current path and the resistor while closing the open-close control element.

A power conversion system for converting input power into output power according to a second exemplary aspect of the present disclosure includes an upper-arm switching element having an input terminal, an output terminal, and an on-off control terminal. The power conversion system includes a lower-arm switching element having an input terminal, an output terminal, and an on-off control terminal and connected in series to the upper-arm switching element. The power conversion system includes drive units provided for the respective upper- and lower-arm switching elements. Each of the drive units is configured to turn on or off, in response to a command signal, a corresponding one of the upper- and lower-arm switching elements. Each of the driving device includes a resistor provided on a current path connected to the on-off control terminal of a corresponding one of the upper- and lower-arm switching elements. The current path permits a drive current to flow therethrough to or from the on-off control terminal of a corresponding one of the upper- and lower-arm switching elements. Each of the driving device includes a switching rate setter configured to set a switching rate of switching a corresponding one of the upper- and lower-arm switching elements from one of an on state and an off state to the other thereof. Each of the driving device includes a current adjusting unit including an open-close control element provided on the current path for electrically opening or closing the current path. The current adjusting unit is configured to adjust, according to the switching rate set by the switching rate setter, the drive current flowing through the current path and the resistor while closing the open-close control element.

The current adjusting unit adjusts, according to the switching rate set by the switching rate setter, the drive current flowing through the current path and the resistor while closing the open-close control element. This current adjustment according to each of the first and second exemplary aspects of the present disclosure differs clearly from the above conventional current adjustment that requires a plurality of current paths having different resistance values from each other, and a plurality of path switching elements for selecting one of the plurality of current paths. This therefore simplifies the structure of the drive unit, thus enabling the rate of switching the switching element from one of the on state and the off state to the other thereof to be variably set while the drive unit has a lower size.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of an embodiment with reference to the accompanying drawings in which:

FIGS. 3A to 3E is a joint timing chart schematically illustrating how predetermined parameters associated with a switching element change in a first charging pattern for switching the switching element according to the embodiment;

FIGS. 4A to 4E is a joint timing chart schematically illustrating how the predetermined parameters associated with a switching element change in a second charging pattern for switching the switching element according to the embodiment;

FIGS. 5A to 5E is a joint timing chart schematically illustrating how the predetermined parameters associated with a switching element change in a third charging pattern for switching the switching element according to the embodiment;

FIGS. 6A to 6E is a joint timing chart schematically illustrating how the predetermined parameters associated with a switching element change in a first discharging pattern for switching the switching element according to the embodiment;

FIGS. 7A to 7E is a joint timing chart schematically illustrating how the predetermined parameters associated with a switching element change in a second discharging pattern for switching the switching element according to the embodiment;

FIGS. 8A to 8E is a joint timing chart schematically illustrating how the predetermined parameters associated with a switching element change in a third discharging pattern for switching the switching element according to the embodiment;

DETAILED DESCRIPTION OF EMBODIMENT

The following describes a specific embodiment of the present disclosure with reference to the accompanying drawings.

First, the following describes a power conversion system 100 including a converter 20 and an inverter 30 as examples of power converters, to which driving devices for switching elements according to the embodiment of the present disclosure have been applied, with reference to FIGS. 1 to 12.

For example, the power conversion system 100 is installed in a vehicle equipped with a motor-generator (MG) 11 as a main engine for moving the vehicle.

Figure 1:
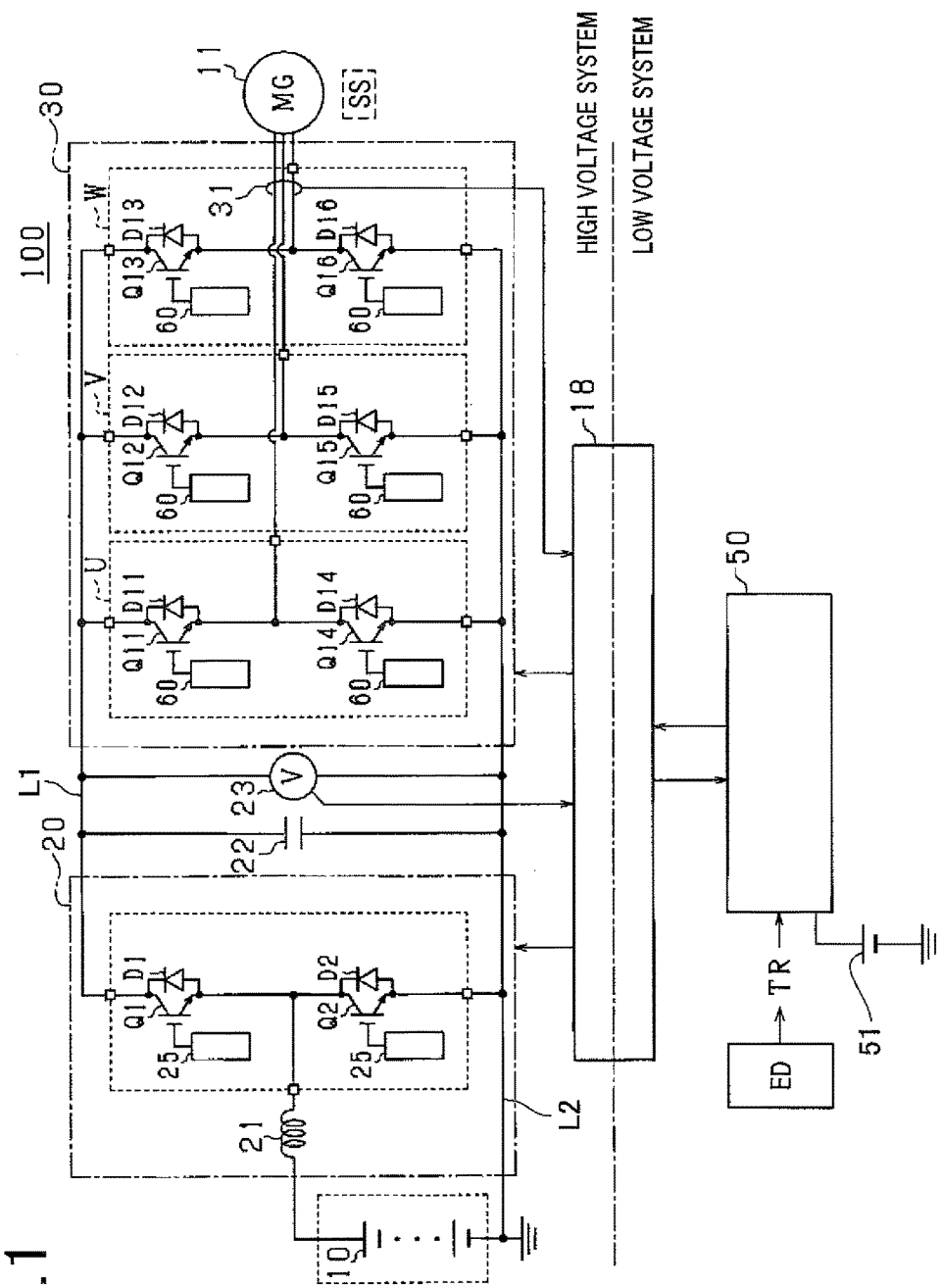
FIG. 1 is a circuit diagram schematically illustrating an example of the overall structure of a power conversion system according to the embodiment of the present disclosure.

Referring to FIG. 1, the power conversion system 100 includes the converter 20, the inverter 30, the MG 11, a smoothing capacitor 22, a voltage sensor 23, drive units 25 and 60, a current sensor 31, a control device 50, and an interface 18.

The MG 11 includes a rotor and a stator. For example, the rotor is directly or indirectly coupled to driving wheels of the vehicle. The MG 11 is electrically connected to a high-voltage battery 10 via the converter 20 and the inverter 30. The embodiment uses a three-phase MG as the MG 11.

The stator of the MG 11 includes three-phase windings connected to the inverter 30, and the inverter 30 is connected to the converter 20. The converter 20 is connected to the high-voltage battery 10. The MG 11 serves as both a motor and a power generator. When serving as a motor, the MG 11 provides rotation to the driving wheels via the motor, thus moving the vehicle. When serving as a power generator, the MG 11 generates electrical power to charge the high-voltage battery 10 via the inverter 30 and the converter 20 and/or to be supplied to electrical components (not shown).

For example, the MG 11 is designed as a three-phase synchronous motor or a three-phase induction motor. The embodiment can use one of various types of multiphase motors as the MG 11.

The embodiment for example uses, as the high-voltage battery 10, a capacitor or a rechargeable battery, such as a lithium-ion battery or a nickel-hydrogen battery. The high-voltage battery 10 has a high terminal voltage, i.e. a high output voltage.

The converter 20 is designed as, for example, a DC-DC converter capable of both stepping up and stepping down the terminal voltage across the high-voltage battery 10. For example, the converter 20 includes an inductor, i.e. a reactor, 21, an upper-arm switching element Q1, and a lower-arm switching element Q2 connected in series to the upper-arm switching element Q1. The converter 20 also includes a flywheel diode D1 and a flywheel diode D2.

The inductor 21 has opposing first and second ends, and the first end is connected to the positive terminal of the high-voltage battery 10. The negative terminal of the high-voltage battery 10 is connected to a common signal ground of the converter 20. The second end of the inductor 21 is connected to the connection point between the switching elements Q1 and Q2. The flywheel diode D1 is connected in antiparallel to the switching element Q1 to permit a current to flow from an output terminal to an input terminal of the switching element Q1. Similarly, the flywheel diode D2 is connected in antiparallel to the switching element Q2 to permit a current to flow from an output terminal to an input terminal of the switching element Q2.

For example, the embodiment uses IGBTs, as an example of switching elements, as the upper- and lower-arm switching elements Q1 and Q2. MOSFETs or bipolar transistors can also be used as the upper- and lower-arm switching elements Q1 and Q2. If MOSFETs are individually used as the upper- and lower-arm switching elements Q1 and Q2, intrinsic diodes of the MOSFETs can be used as the flywheel diodes.

Specifically, the emitter, i.e. the output terminal, of the switching element Q1 is connected to the collector, i.e. the input terminal, of the switching element Q2 to constitute a series-connection switch. The collector of the switching element Q1 is connected to a first power supply line L1 of the power conversion system 100. The emitter of the switching element Q2 is connected to both the negative terminal of the high-voltage battery 10 and a second power supply line, i.e. the common ground line, L2 of the power conversion system 100. The gates, i.e. the on-off control terminals, of the switching elements Q1 and Q2 are individually connected to the corresponding drive units 25.

The inverter 20 can operate in a power running mode to output an alternating-current (AC) voltage to the MG 11, and a regenerative mode to convert an AC voltage output from the MG 11 to a DC voltage and output the DC voltage to the converter 20.

On and off operations of the upper- and lower-arm switching elements Q1 and Q2 while the inverter 20 is operating in the power running mode boosts the terminal voltage, i.e. the terminal DC voltage, across the high-voltage battery 10 to a desired voltage Vdc. The boosted voltage Vdc is smoothed by the smoothing capacitor 22, and thereafter applied to the inverter 30. The following refers to the boosted voltage Vdc applied to the inverter 30 as a power supply voltage, i.e. a system voltage, Vdc for the inverter 30.

On and off operations of the upper- and lower-arm switching elements Q1 and Q2 of the converter 20 while the inverter 30 is operating in the regenerative mode steps down a DC voltage output from the inverter 30 via the smoothing capacitor 21. The stepped down DC voltage is supplied to the high-voltage battery 10 so that the stepped down DC voltage charges the high-voltage battery 10.

In particular, the converter 20 controls, for example, a variable duty, i.e. a duty factor, for each predetermined switching period for each of the switching elements Q1 and Q2 under control of the control device 50 to adjust, within a predetermined voltage range, the power supply voltage Vdc to be supplied to the inverter 30 accordingly. The duty factor represents a predetermined ratio, i.e. percentage, of an on duration to the total duration of each of the switching elements Q1 and Q2 for each predetermined switching period. The predetermined voltage range includes, for example, the terminal voltage across the high-voltage battery 10 as its lower limit, and a predetermined higher voltage as its upper limit.

The inverter 30 is a three-phase inverter. The inverter 30 includes

1. A U-phase arm comprised of a first pair of upper- and lower-arm switching elements Q11 and Q14 connected in series to each other 2. A V-phase arm comprised of a second pair of upper- and lower-arm switching elements Q12 and Q15 connected in series to each other 3. A W-phase arm comprised of a third pair of upper- and lower-arm switching elements Q13 and Q16 connected in series to each other.

The U-, V-, and W-phase arms are connected in parallel to each other. The connection point between the upper- and lower-arm switching elements Q11 and Q14 of the U-phase arm is connected to a first end of the U-phase winding of the MG 11. Similarly, the connection point between the upper- and lower-arm switching elements Q12 and Q15 of the V-phase arm is connected to a first end of the V-phase winding of the MG 11. The connection point between the upper- and lower-arm switching elements Q13 and Q16 of the W-phase arm is connected to a first end of the W-phase winding of the MG 11.

Second ends of the U-, V-, and W-phase windings are connected to each other. That is, the three-phase windings are connected to each other in star connection. The three-phase windings can be connected to each other in delta connection, and the three-phase windings in the delta connection can be connected to the connection points of the respective U-, V-, and W-arms.

For example, the embodiment uses an IGBT, as an example of switching elements, as each of the upper- and lower-arm switching elements Q11 to Q16. The inverter 30 includes flywheel diodes D11 to D16. Each of the flywheel diodes D11 to D16 is connected in antiparallel to a corresponding one of the switching elements Q11 to Q16. MOSFETs or bipolar transistors can also be used as the upper- and lower-arm switching elements Q11 to Q16. If MOSFETs are individually used as the upper- and lower-arm switching elements of the inverter 30, intrinsic diodes of the MOSFETs can be used as the flywheel diodes.

Specifically, the emitter of each of the upper-arm switching elements Q11 to Q13 is connected to the collector of the corresponding one of the lower-arm switching elements Q14 to Q16 to constitute a corresponding one of the U-, V-, and W-arms. The collectors of the upper-arm switching elements Q11 to Q13 are connected to the first power supply line L1. The emitters of the lower-arm switching elements Q14 to Q16 are connected to the second power supply line L2. The gates, i.e. the on-off control terminals, of the upper- and lower-arm switching elements Q11 to Q16 are individually connected to the corresponding drive units 60.

The voltage sensor 23 measures the power supply voltage Vdc, and outputs a measurement signal indicative of the power supply voltage Vdc to the control device 50 via the interface 18.

The current sensor 31 measures output currents, i.e. alternating currents, Tout from the inverter 30 to flow through the respective three-phase windings of the MG 11, and outputs, to the control device 50 via the interface 18, measurement signals indicative of the measured output currents Iout.

For example, the control device 50 is essentially comprised of a microcomputer circuit including, for example, a CPU, a ROM, a RAM, and other known peripheral devices. The control device 50 is connected to an external control device ED for inputting, to the control device 50, request torque TR as an example of request values for one of the controlled variables of the MG 11. For example, the embodiment uses an electronic control unit (ECU) installed in the vehicle, which is higher in hierarchy than the control device 50, as the external control device ED if the control devices are arranged in a hierarchical relationship.

The control device 50 operates using a terminal voltage of a low-voltage battery 51, and controls the converter 20 and the inverter 30. This control adjusts one of the controlled variables, i.e. output torque, of the MG 11 to the request value, i.e. the request torque TR, for the MG 11.

Specifically, the control device 50 generates pulsed command signals for driving the respective switching elements Q1, Q2, Q11, Q12, Q13, Q14, Q15, and Q16 according to the request torque TR and the measurement signals input thereto from the sensors 23 and 31. For example, the pulsed command signals for the respective switching elements Q1, Q2, Q11, Q12, Q13, Q14, Q15, and Q16 are PWM signals each consisting of a train of pulses having a variable duty, i.e. a duty factor, for each predetermined switching period.

That is, the duty factors of the command signals for the respective switching elements Q1, Q2, Q11, Q12, Q13, Q14, Q15, and Q16 are required to adjust the output torque of the MG 11 to match with the request torque TR. The control device 50 outputs the command signals generated for the respective switching elements Q1, Q2, Q11, Q12, Q13, Q14, Q15, and Q16 to the corresponding drive units 25 and 60.

Each of the drive units 25 and 60 is comprised of, for example, a single-chip IC 61, a low-voltage power source PS connected to each other, and other components described in detail later.

Each of the drive units 25 generates a drive signal according to the duty factor of a corresponding one of the command signals sent from the control device 50. Then, each of the drive units 25 applies the corresponding drive signal to the gate of a corresponding one of the switching elements Q1 and Q2, thus controlling on and off operations of a corresponding one of the switching elements Q1 and Q2. This controls the power supply voltage Vdc to be supplied to the inverter 30.

Similarly, each of the drive units 60 generates a drive signal according to the duty factor of a corresponding one of the command signals sent from the control device 50. Then, each of the drive units 60 applies the corresponding drive signal to the gate of a corresponding one of the switching elements Q11 to Q16. This controls on and off operations of a corresponding one of the switching elements Q11 to Q16 according to the duty factor of a corresponding one of the command signals, thus controlling the output currents Tout to adjust the output torque of the MG 11 to the request torque TR.

The command signals for the upper- and lower-arm switching elements of each of the U-, V-, and W-arms cause the corresponding drive units 60 to alternately, i.e. complementarily, turn on the upper- and lower-arm switching elements. If the upper- and lower-arm switching element of one of the U-, V-, and W-arms were simultaneously on, a dead short, i.e. a short circuit path between the positive and negative terminals of the high-voltage battery 10, would take place. For this reason, the command signals for the upper- and lower-arm switching elements of each of the U-, V-, and W-arms are configured such that a dead time is ensured between each on duration of one of the upper- and lower-arm switching elements and the subsequent on duration of the other of the upper- and lower-arm switching elements.

That is, the command signals for the upper- and lower-arm switching elements of each of the U-, V-, and W-arms cause the corresponding drive units 60 to (1) Turn on one of the corresponding upper- and lower-arm switching elements for a corresponding on duration;

(2) Turn off one of the corresponding upper- and lower-arm switching elements by the elapse of the corresponding on duration;

(3) Keep both the upper- and lower-arm switching elements off during the corresponding dead time (4) Turn on the other of the corresponding upper- and lower-arm switching elements by the elapse of the corresponding on duration.

This prevents dead short from occurring in each of the U-, V-, and W-arms.

Each of the drive units 25 and 60 is also configured to monitor how a corresponding one of the switching elements Q11 to Q16 is driven.

The interface 18 enables a high-voltage system comprised of the high-voltage battery 10, the converter 20, each drive units 25 and 60, the sensors 23 and 31, the inverter 30, and the MG 11 to be electrically isolated from a low-voltage system comprised of the control device 50. This protects the low-voltage system, i.e. the control device 50, against the terminal voltage across the high-voltage battery 10 and the power supply voltage Vdc supplied to the inverter 30; each of the terminal voltage and the power supply voltage Vdc can reach as high as hundreds of volts.

The interface 18 includes, for example, photocouplers as an example of electrical isolators provided for the respective switching elements Q1, Q2, and Q11 to Q16. Specifically, each of the photocouplers is configured to enable the control device 50 to control a corresponding one of the switching elements Q1, Q2, and Q11 to Q16 while establishing electrical isolation between the control device 50 and a corresponding one of the switching elements Q1, Q2, and Q11 to Q16.

Next, the following describes an example of the structure of each of the drive units 60 provided for the respective switching elements Q11 to Q16 of the inverter 30. The drive units 60 provided for the respective switching elements Q11 to Q16 of the inverter 30 intrinsically have identical structures, so that the following describes the structure of the drive unit 60 provided for the upper-arm switching elements Q11 as an example with reference to FIG. 2.

Figure 2:
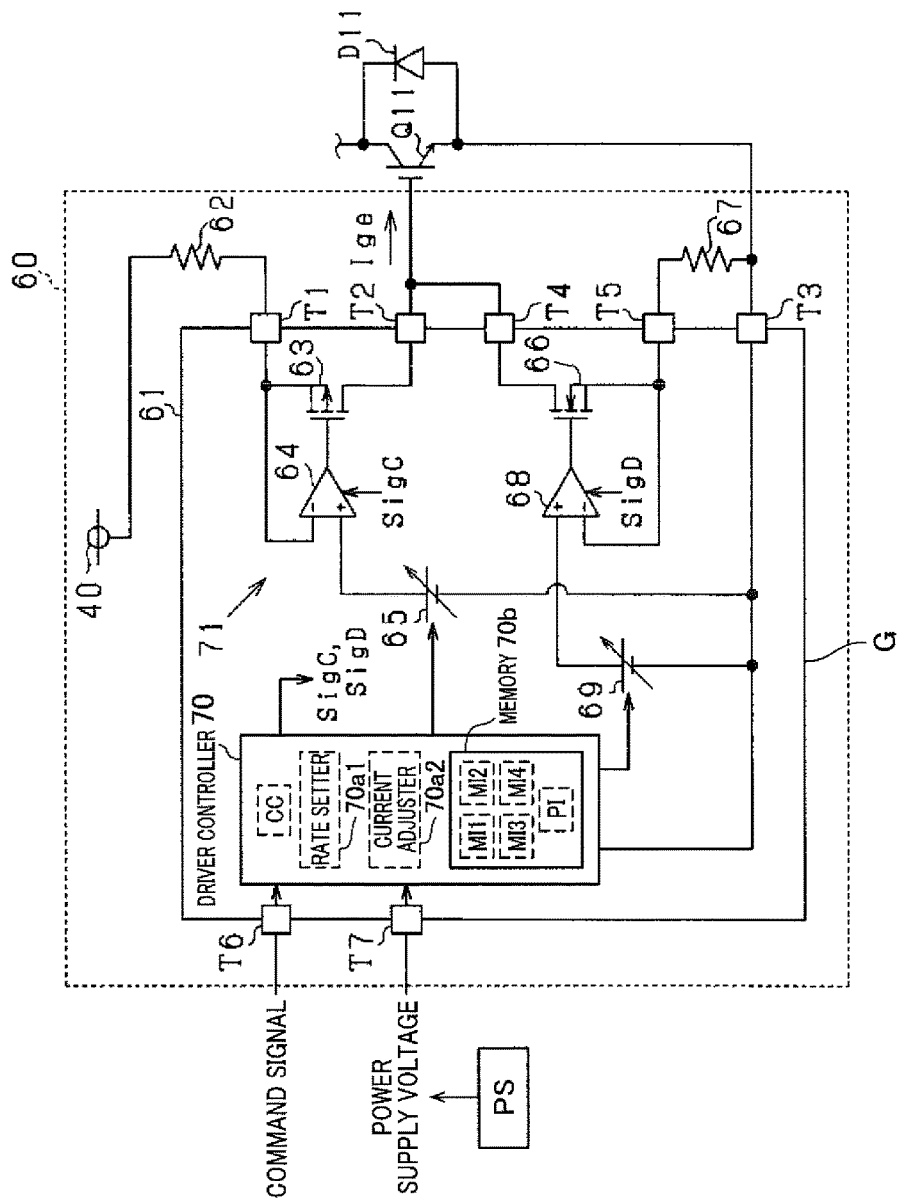
FIG. 2 is a circuit diagram schematically illustrating an example of the circuit structure of a drive unit for a switching element of an inverter illustrated in FIG. 1.

Referring to FIG. 2, the drive unit 60 provided for the switching element Q11 includes the single-chip IC 61 having first to seventh terminals T1 to T7. The drive unit 60 also includes a charging resistor 62 and a discharging resistor 67.

The IC 61 includes, for example, a drive controller 70 and a current adjuster 71 connected to the sixth and seventh terminals T6 and T7. The sixth terminal T6 is connected to the control device 50 via the interface 18, and the seventh terminal T7 is connected to the low-voltage power source PS.

The IC 61 operates based on an operating voltage, i.e. a power supply voltage, supplied from the low-voltage power source PS via the sixth terminal T6 to (1) Control on-off operations of the switching element Q11 according to the command signal input from the control device 50 via the sixth terminal T6

(2) Variably set the rate of switching the switching element Q11 from the on state to the off state (3) Variably set the rate of switching the switching element Q11 from the off state to the on state.

The drive controller 70 is connected to the sixth and seventh terminals T6 and T7. The drive controller 70 is configured to determine the rate of switching the switching element Q11 from one of the on state and the off state and the other thereof according to at least one parameter. The at least one parameter correlates with operating characteristics of the switching element Q11. In particular, the at least one parameter correlates with a surge and/or a value of power loss that may occur when the switching element Q11 is switched from one of the on state and the off state and the other thereof. The embodiment refers to the parameter as a rate adjustment parameter.

Specifically, the drive controller 70 according to the embodiment includes a switching rate setter 70a1 designed as a hardware module or a software module. The switching rate setter 70a1 is configured to set the rate, i.e. speed, of switching the switching element Q11 from one of the on state and the off state to the other thereof according to, for example, the power supply voltage Vdc for the inverter 30 as an example of the rate adjustment parameter. One reason of using the power supply voltage Vdc for the inverter 30 as the rate adjustment parameter is that the breakdown voltage of each of the switching elements Q11 to Q16 is designed depending on the power supply voltage Vdc for the inverter 30 and a predicted maximum level of a surge that can be generated in the corresponding switching element.

For example, the switching rate setter 70a1 according to the embodiment can be configured to obtain, from, for example, the measurement signal sent from the voltage sensor 23, the collector-emitter voltage Vce of the switching element Q11 as an example of the rate adjustment parameter; the collector-emitter voltage Vce correlates with the power supply voltage Vdc for the inverter 30. The switching rate setter 70a1 can be configured to vary the rate of switching the switching element Q11 from one of the on state and the off state to the other thereof such that the higher the collector-emitter voltage Vce is, the lower the rate of switching the switching element Q11 is. Note that the collector-emitter voltage Vce of the switching element Q11 serves as a saturation voltage Vcesat while the switching element Q11 is in the on state. Thus, the collector-emitter voltage Vce may cause power loss and a surge during the on state of the switching element Q11.

The switching rate setter 70a1 can also be configured to vary the rate of switching the switching element Q11 from one of the on state and the off state to the other thereof according to a collector-emitter current Ice flowing between the collector and emitter of the switching element Q11 as an example of the rate adjustment parameter. For example, the switching rate setter 70a1 is capable of receiving the measurement signals indicative of the measured output currents Iout, and calculating the value of the collector-emitter current Ice according to the received measurement signals indicative of the measured output currents Iout. Note that the switching rate setter 70a1 can be configured to measure the collector-emitter current Ice according to a sense current flowing through a sense terminal of the switching element Q11; the sense current correlates with the collector-emitter current Ice. The switching rate setter 70a1 can be configured to measure the sense current, thus obtaining the collector-emitter current Ice accordingly. Note that the collector-emitter current Ice flowing in the switching element Q11 causes on loss across the switching element Q11 while the switching element Q11 is in the on state. Thus, the collector-emitter current Ice may cause power loss and a surge during the on state of the switching element Q11.

The following can also simply refer to the rate of switching the switching element Q11 from one of the on state and the off state to the other thereof as a switching rate of the switching element Q11 hereinafter.

The current adjuster 71 is operative to adjust a drive current Ige to flow to or from the gate of the switching element Q11 under control of the drive controller 70 to turn on or off the switching element Q11 accordingly.

Specifically, adjustment of the drive current Ige to flow as a gate charging current to the gate of the switching element Q11 charges the gate of the switching element Q11, that is, stores electrical charge in the gate of the switching element Q11. This yields an increase of the drive voltage of the switching element Q11, i.e. the gate voltage of the switching element Q11, thus turning on the switching element Q11.

Adjustment of the drive current Ige to flow as a gate discharging current from the gate of the switching element Q11 discharges the gate of the switching element Q11, that is, discharges the electrical charge stored in the gate of the switching element Q11. This yields a decrease of the drive voltage of the switching element Q11, i.e. the gate voltage of the switching element Q11, thus turning off the switching element Q11.

The current adjuster 71 is also operative to adjust, based on the switching rate of the switching element Q11 determined by the drive controller 70, the magnitude of the charging current or the discharging current. This adjustment enables an actual switching rate of the switching element Q11 between the on state and the off state to be adjusted.

Next, the following describes an example of the specific structure of the current adjuster 71.

The current adjuster 71 includes a constant-voltage source 40, a charging switching element 63 serving as for example, an open-close control element, a first operational amplifier 64, and a first DC power source 65. The current adjuster 71 also includes a discharging switching element 66 serving as, for example, an open-close control element, a second operational amplifier 68, and a second DC power source 69.

The embodiment for example uses a P-channel MOSFET as the charging switching element 63, and uses an N-channel MOSFET as the discharging switching element 66.

The constant-voltage source 40 has opposing first and second ends, and the charging resistor 62 has opposing first and second ends. The first end of the constant-voltage source 40 is connected to the first end of the charging resistor 62, and the second end of the constant-voltage source 40 is connected to a common ground G of the IC 61. The second end of the charging resistor 62 is connected to the first terminal T1.

The source of the charging switching element 63 is connected to the first terminal T1. The drain of the charging switching element 63 is connected to the second terminal T2, and, to the second terminal T2, the gate of the switching element Q11 is connected. That is, the gate of the switching element Q11 is connected to the first terminal T1 via the charging switching element 63 and the second terminal T2.

The first operational amplifier 64 has a non-inverting input terminal, an inverting input terminal, an output terminal, and an enable-signal terminal. The non-inverting input terminal of the first operational amplifier 64 is connected to the positive terminal of the first DC power source 65. The inverting input terminal of the first operational amplifier 64 is connected to the first terminal T1. The output terminal of the first operational amplifier 64 is connected to the gate of the charging switching element 63. The negative terminal of the first DC power source 65 is connected to the common ground G of the IC 61. Note that whether an enable signal SigC is input to the enable-signal terminal of the first operational amplifier 64 enables the first operational amplifier 64 to be activated or deactivated.

Specifically, the first operational amplifier 64 is configured such that the two inputs are virtually short-circuited via the charging switching element 63 while the first operational amplifier 64 is operating for a period during which the enable signal SigC is input to the enable terminal of the first operational amplifier 64. For this reason, the first operational amplifier 64 is configured to drive the charging switching element 63, so that the potential at the first terminal T1 is maintained at the potential at the positive terminal of the first DC power source 65.

That is, when activated, the virtually short-circuited first operational amplifier 64 turns on or off, i.e. close or open, the charging switching element 63 as a variable resistor, thus matching the potential at the first terminal T1 with the potential at the positive terminal of the first DC power source 65. This makes it possible to supply a constant charging current to the gate of the switching element Q11. The drive controller 70 is connected to the first DC power source 65, and to control the potential at the positive terminal of the first DC power source 65, that is, the terminal voltage across the first DC power source 65.

The above operations of the first operational amplifier 64, the charging switching element 63, and the first DC power source 65 serve as a charging task of the gate of the switching element Q11.

This configuration enables the voltage at the first terminal T1 to be adjusted depending on the terminal voltage across the first DC power source 65. This adjustment changes the charging current flowing through the charging resistor 62 to the gate of the switching element Q11 based on a constant voltage output from the constant-voltage source 40.

In other words, the current adjuster 71 generates a constant charging current whose value depends on the output voltage of the first DC power source 65, the resistance of the charging resistor 62, and the constant voltage output from the constant-voltage source 40. The current adjuster 71 also supplies the constant charging current to the gate of the switching element Q11, thus charging the gate of the switching element Q11.

Note that the structure of the current adjuster 71 for adjusting the charging current for charging the gate of the switching element Q11 is not limited to the structure illustrated in FIG. 2, and can be freely designed according to one of known structures for adjusting the charging current for charging the gate of a switching element.

The gate of the switching element Q11 is also connected to the fourth terminal T4. The drain of the discharging switching element 66 is connected to the fourth terminal T4. The source of the discharging switching element 66 is connected to the fifth terminal T5. The discharging resistor 67 has opposing first and second ends. The first end of the discharging resistor 67 is connected to the fifth terminal T5, and the second end of the discharging resistor T5 is connected to the common ground G via the third terminal T3. That is, the gate of the switching element Q11 is connected to the fifth terminal T5 via the fourth terminal T4 and the discharging switching element 64.

The second operational amplifier 68 has a non-inverting input terminal, an inverting input terminal, an output terminal, and an enable-signal terminal. The non-inverting input terminal of the second operational amplifier 68 is connected to the positive terminal of the second DC power source 69. The inverting input terminal of the second operational amplifier 68 is connected to the fifth terminal T5. The output terminal of the second operational amplifier 68 is connected to the gate of the discharging switching element 66. The negative terminal of the second DC power source 69 is connected to the common ground G of the IC 61.

Note that whether an enable signal SigD is input to the enable-signal terminal of the second operational amplifier 68 enables the second operational amplifier 68 to be activated or deactivated.

Specifically, the second operational amplifier 68 is configured such that the two inputs are virtually short-circuited via the discharging switching element 66 while the second operational amplifier 91 is operating for a period during which the enable signal SigD is input to the enable terminal thereof. For this reason, the second operational amplifier 68 is configured to drive the discharging switching element 68, so that the potential at the fifth terminal T5 is maintained at the potential at the positive terminal of the second DC power source 69.

That is, when activated, the virtually short-circuited second operational amplifier 68 turns on or off, i.e. close or open, the discharging switching element 66 as a variable resistor, thus matching the potential at the fifth terminal T5 with the potential at the positive terminal of the second DC power source 69. This makes it possible to cause a constant discharging current to flow from the gate of the switching element Q11. The drive controller 70 is connected to the second DC power source 69, and to control the potential at the positive terminal of the second DC power source 69, that is, the terminal voltage across the second DC power source 69.

The above operations of the second operational amplifier 68, the discharging switching element 66, and the second DC power source 69 serve as a discharging task of the gate of the switching element Q11.

This configuration enables the voltage at the fifth terminal T5 to be adjusted depending on the terminal voltage across the second DC power source 69. This adjustment changes the discharging current from the gate of the switching element Q11 based on the terminal voltage across the second DC power source 69.

In other words, the current adjuster 71 causes a constant discharging current whose value depends on the output voltage of the second DC power source 69 and the resistance of the discharging resistor 67 to flow from the gate of the switching element Q11, thus discharging the gate of the switching element Q11.

Note that the structure of the current adjuster 71 for adjusting the discharging current for discharging the gate of the switching element Q11 is not limited to the structure illustrated in FIG. 2, and can be freely designed according to one of known structures for adjusting the discharging current for discharging the gate of a switching element.

The drive controller 70 is configured to alternately perform, according to the corresponding command signal input thereto via the sixth terminal T6, the charging task and the discharging task set forth above.

Specifically, the drive controller 70 stops the output of the enable signal SigD to the second operational amplifier 68 to deactivate the second operational amplifier 68. After the lapse of a corresponding dead time from stopping the output of the enable signal SigD, the drive controller 70 outputs the enable signal SigC to the first operational amplifier 64 during the on duration of the command signal to activate the first operational amplifier 64. This performs the charging task based on the operations of the first operational amplifier 64, the charging switching element 63, and the first DC power source 65.

The drive controller 70 also stops the output of the enable signal SigC to the first operational amplifier 64 to deactivate the first operational amplifier 64. After the lapse of a corresponding dead time from the stopping the output of the enable signal SigC, the drive controller 70 outputs the enable signal SigD to the second operational amplifier 68 during the off duration of the command signal to activate the second operational amplifier 68. This performs the discharging task based on the operations of the second operational amplifier 68, the discharging switching element 66, and the second DC power source 69.

Additionally, the drive controller 70 includes a current adjuster 70a2 designed as a hardware module or a software module. The current adjuster 70a2 is configured to adjust the output voltage from the first DC power source 65 according to the determined switching rate of the switching element Q11 from the off state to the on state. This adjustment controls the charging current for charging the gate of the switching element Q11. The following refers to the switching rate of the switching element Q11 from the off state to the on state as an on switching rate, and the following refers to the switching rate of the switching element Q11 from the on state to the off state as an off switching rate.

For example, the drive controller 70 includes a memory 70b storing first map information MI1. The first map information MI1 represents the correlations between values of the output voltage from the first DC power source 65 and corresponding values of the on switching rate of the switching element Q11. The current adjuster 70a2 extracts, from the memory 70b, a value of the output voltage from the first DC power source 65; the extracted value of the output voltage from the first DC power source 65 matches with the on switching rate determined thereby. The current adjuster 70a2 adjusts the output voltage from the first DC power source 65 to match an actual value of the output voltage from the first DC power source 65 with the extracted value of the output voltage from the first DC power source 65.

An increase of a gate-emitter voltage, i.e. a gate voltage, Vge of the switching element Q11 to be equal to or higher than a predetermined threshold voltage Vth results in the switching element Q11 being switched from the off state to the on state.

Similarly, the current adjuster 70a2 adjusts the output voltage from the second DC power source 68 according to the off switching rate determined thereby. This adjustment controls the discharging current for discharging the gate of the switching element Q11.

For example, the memory 70b stores second map information MI2. The second map information MI2 represents the correlations between values of the output voltage from the second DC power source 68 and corresponding values of the off switching rate of the switching element Q11. The current adjuster 70a2 extracts, from the memory 70b, a value of the output voltage from the second DC power source 68; the extracted value of the output voltage from the second DC power source 68 matches with the off switching rate determined thereby. The current adjuster 70a2 adjusts the output voltage from the second DC power source 68 to match an actual value of the output voltage from the second DC power source 68 with the extracted value of the output voltage from the second DC power source 68.

A decrease of the gate-emitter voltage Vge of the switching element Q11 to be lower than the threshold voltage Vth results in the switching element Q11 being switched from the on state to the off state.

The structure of each of the drive units 60 of the other switching elements Q12 to Q16 is identical to that of the drive unit 60 of the switching element Q11. Similarly, the structure of each of the drive units 25 of the switching elements Q1 and Q2 of the converter 20 is identical to that of the drive unit 60 of the switching element Q11.

As described above, the current adjuster 70a2 enables the drive current Ige, i.e. the gate charging current, to be adjusted to a desired value during a predetermined turn-on period of each of the switching elements Q1, Q2, and Q11 to Q16. The turn-on period of a switching element represents a period from the start of charging the gate of the switching element to the complete on of the switching element.

Similarly, the current adjuster 70a2 enables the magnitude of the drive current Ige, i.e. the gate discharging current, to be adjusted to a desired value during a predetermined turn-off period of each of the switching elements Q1, Q2, and Q11 to Q16. The turn-off period of a switching element represents a period from the start of discharging the gate of the switching element to the complete off of the switching element.

In particular, the current adjuster 70a2 according to the embodiment is specially configured to change the drive current Ige in a predetermined first adjustment pattern when charging the gate of each of the switching elements Q1, Q2, and Q11 to Q16. This aims to achieve reduction of power loss and a sufficiently efficient dead time when each of the switching elements Q1, Q2, and Q11 to Q16 is switched from the off state to the on state.

Similarly, the current adjuster 70a2 according to the embodiment is specially configured to change the drive current Ige in a predetermined second adjustment pattern when discharging the gate of each of the switching elements Q1, Q2, and Q11 to Q16. This aims to achieve reduction of power loss and a sufficiently efficient dead time when each of the switching elements Q1, Q2, and Q11 to Q16 is switched from the on state to the off state.

That is, the current adjuster 70a2, the charging switching element 63, the first operational amplifier 64, the first DC power source 65, the discharging switching element 66, the second operational amplifier 68, and the second DC power source 69 serve as, for example, a current adjusting means or unit.

The following describes (1) The first adjustment pattern of the drive current Ige for switching each of the switching elements Q1, Q2, and Q11 to Q16 from the off state to the on state, i.e. for charging the gate of each of the switching elements Q1, Q2, and Q11 to Q16

(2) The second adjustment pattern of the drive current Ige for switching each of the switching elements Q1, Q2, and Q11 to Q16 from the on state to the off state, i.e. for discharging the gate of each of the switching elements Q1, Q2, and Q11 to Q16.

The drive controller 70, i.e. the current adjuster 70a2, is configured to adjust both the drive current Ige in the first adjustment pattern and the drive current Ige in the second adjustment pattern using, for example, a timer circuit CC installed therein. That is, the drive controller 70, i.e. the current adjuster 70a2, controls when the drive current Ige is changed in each of the first and second adjustment patterns using the timer circuit CC. Specifically, the drive controller 70, i.e. the current adjuster 70a2, controls change of the output voltage from the first DC power source 65 to adjust the drive current Ige in each of the first adjustment pattern and the second adjustment pattern. The following refers to each of the switching elements Q1, Q2, and Q11 to Q16 collectively as a switching element Q.

For example, the memory 70b stores beforehand information about the first and second adjustment patterns of the drive current Ige as pattern information PI.

First, the following describes first to third charging patterns as examples of the first adjustment pattern for switching the switching element Q from the off state to the on state in accordance with the pattern information PI.

FIGS. 3A to 3E illustrates a joint timing chart for schematically describing the first charging pattern, and FIGS. 4A to 4E illustrates a joint timing chart for schematically describing the second charging pattern of a lower-arm switching element Q that is a selected one of the lower-arm switching elements Q12, Q14, and Q16. In particular, FIG. 3A illustrates how the pulsed command signal for the switching element Q changes, FIG. 3B illustrates how the gate voltage Vge of the switching element Q changes, and FIG. 3C illustrates how the drive current Ige of the switching element Q serving as a gate current changes. FIG. 3D also illustrates how the collector-emitter current Ice of the switching element Q changes, and FIG. 3E illustrates how the collector-emitter voltage Vce of the switching element Q changes. In FIG. 3B, each of reference characters I1 and I2 represents a corresponding one of a first magnitude and a second magnitude of the drive current Ige; the first magnitude, i.e. the first level, I1 is smaller than the second magnitude I2.

FIG. 4A illustrates how the pulsed command signal for an upper-arm switching element corresponding to the lower-arm switching element Q changes, and how the pulsed command signal for the lower-arm switching element Q changes. FIGS. 4B to 4E, which correspond to respective FIGS. 3B to 3E, illustrates how the corresponding parameters change like FIGS. 3B to 3E.

In FIGS. 3A to 3E, the drive controller 70 changes the drive current Ige, which flows to the gate of the switching element Q, to the first level I1 from zero in response to the rising of the corresponding command signal at time t11 so that the charging of the gate of the switching element Q is started. The drive controller 70 maintains the drive current Ige at the first level I1. The drive controller 70 causes the drive current Ige to rise from the first level I1 to the second level I2 at time t13 when a predetermined first adjustment period TA has elapsed since the time t11. That is, the drive controller 70 changes the drive current Ige stepwisely from the time t11 to the time t13.

After the time t11, the gate voltage Vge increases gradually up to a predetermined Miller voltage of the switching element Q, and thereafter maintains at the Miller voltage Vm for a predetermined Miller period. After completion of the Miller period, the gate voltage Vge increases gradually again. The collector-emitter current Ice starts to flow and the collector-emitter voltage Vce starts to decrease when the gate voltage Vge has reached the threshold voltage Vth at time t12. The time t13 at which the gate voltage Vge is switched from the first level I1 to the second level I2 is defined as the timing or thereabout at which the gate voltage Vge has reached the Miller voltage Vm. Note that, when the gate voltage Vge has risen or fallen to the Miller voltage Vm, the gate voltage Vge remains at the Miller voltage Vm for the Miller period. The Miller voltage Vm of the switching element Q is set to be higher than the threshold voltage Vth of the switching element Q. That is, the length of the first adjustment period TA is defined based on the Miller voltage Vm of the switching element Q. The time t13 is defined as a point of time within the period during which the collector-emitter voltage Vce of the switching element Q, falls to zero at time t14. The collector-emitter voltage Vce corresponds to the voltage between the input and output terminals of the switching element Q.

The following describes a first comparison example where the drive controller 70 maintains the drive current Ige at the first level I1 after the rising of the corresponding command signal at the time t11 (see a dashed-dot line in FIG. 3C). FIGS. 3A to 3E illustrate that the first comparison example may cause the collector-emitter voltage Vce to decrease more gradually (see a dashed-dot line indicated by the arrow X in FIG. 3E). This may result in the occurrence of power loss due to the more gradual decrease of the collector-emitter voltage Vce. That is, the period indicated by the arrow X in FIG. 3E represents a tail time during which the decrease of the collector-emitter voltage Vce slows down.

In contrast, controlling the drive current Ige in the first charging pattern illustrated in FIG. 3C increases the drive current Ige at the time t13 to speed up the decrease of the collector-emitter voltage Vce accordingly, thus reducing power loss due to the collector-emitter voltage Vce.

In FIGS. 4A to 4E, the drive controller 70 changes the drive current Ige, which flows to the gate of the switching element Q, to the second level I2 from zero in response to the rising of the command signal for the lower-arm switching element Q at time t21 so that the charging of the gate of the lower-arm switching element Q is started. The drive controller 70 maintains the drive current Ige at the second level I2. The drive controller 70 causes the drive current Ige to fall from the second level I2 to the first level I1 at time t22 when a predetermined second adjustment period TB has elapsed since the time t21. That is, the drive controller 70 changes the drive current Ige stepwisely from the time t21 to the time t22.

After the time t22, the gate voltage Vge increases gradually up to the Miller voltage Vm, and thereafter maintains the Miller voltage Vm for the Miller period. After completion of the Miller period, the gate voltage Vge increases gradually again. The collector-emitter current Ice starts to flow and the collector-emitter voltage Vice starts to decrease when the gate voltage Vge has reached the threshold voltage Vth at the time t22. The time t22 at which the gate voltage Vge is switched from the second level I2 to the first level I1 is defined as the timing at which the gate voltage Vge has reached the threshold voltage Vth after the start of charging the gate of the lower-arm switching element Q based on the second level I2 of the drive current Ige. In other words, the time t22 at which the gate voltage Vge is switched from the second level I2 to the first level I1 is defined as the timing at which the collector-emitter current Ice starts to flow. That is, the length of the second adjustment period TB is defined based on the timing at which the gate voltage Vge has reached the threshold voltage Vth after the start of charging the gate of the lower-arm switching element Q based on the second level I2 of the drive current Ige.

The following describes a second comparison example where the drive controller 70 maintains the drive current Ige at the first level I1 after the rising of the command signal for the lower-arm switching element Q at time t20 (see a dashed-dot line in FIG. 4C). FIGS. 4A to 4E illustrate that the second comparison example may cause the gate voltage Vge to increase more gradually (see a dashed-dot line in FIG. 4B). This may make longer the time taken from the start of charging the gate of the lower-arm switching element Q to the arrival of the gate voltage Vge at the threshold voltage Vth. In other words, this may make longer the time taken from the start of charging the gate of the lower-arm switching element Q to the time at which the collector-emitter current Ice starts to flow. This may need the rising timing t20 of the command signal for the lower-arm switching element Q to be made earlier than the rising timing t21.

In contrast, controlling the drive current Ige in the second charging pattern illustrated in FIG. 4C increases the switching responsivity of the lower-arm switching element Q from the off state to the on state in response to the rising of the command signal for the lower-arm switching element Q.

In other words, the drive controller 70 according to the embodiment delays the rising timing t21 of the command signal for the lower-arm switching element Q relative to the rising timing t20 of the command signal for the lower-arm switching element Q according to the second comparative example if the timing at which the collector-emitter current Ice starts to flow is set to be constant.

This enables the falling timing of the command signal for the upper-arm switching element Q, which has been on, corresponding to the lower-arm switching element Q to be delayed from time t20a to time t20b with a suitable dead time provided between turn-off of the upper-arm switching element Q and turn-on of the lower-arm switching element Q. This results in efficient turn-on operations of the upper- and lower-arm switching elements Q while securing suitable dead times between the upper- and lower-arm switching elements Q.

FIGS. 5A to 5E illustrates a joint timing chart schematically for describing the third charging pattern, which is obtained by combination of the first and second charging patterns, of a lower-arm switching element Q that is a selected one of the lower-arm switching elements Q12, Q14, and Q16.

In FIGS. 5A to 5E, the drive controller 70 changes the drive current Ige to the second level I2 from zero in response to the rising of the command signal for the lower-arm switching element Q at time t31 so that the charging of the gate of the lower-arm switching element Q is started. The drive controller 70 maintains the drive current Ige at the second level I2. The drive controller 70 causes the drive current Ige to fall from the second level I2 to the first level I1 at time t32 when the second adjustment period TB has elapsed since the time t31. That is, the drive controller 70 changes the drive current Ige stepwisely from the time t31 to the time t32.

After the time t31, the gate voltage Vge increases gradually up to the Miller voltage Vm, and thereafter maintains the Miller voltage Vm for the Miller period. After completion of the Miller period, the gate voltage Vge increases gradually again. The collector-emitter current Ice starts to flow and the collector-emitter voltage Vice starts to decrease when the gate voltage Vge has reached the threshold voltage Vth at time t32.

Thereafter, the drive controller 70 causes the drive current Ige to rise from the first level I1 to the second level I2 at time t33 when the first adjustment period TA has elapsed since the time t31. That is, the drive controller 70 changes the drive current Ige stepwisely from the time t31 to the time t33. The drive controller 70 can cause the drive current Ige to rise from the first level I1 to the second level I2 at the time t33 when a predetermined time has elapsed since the time t32. The time t33 at which the gate voltage Vge is switched from the first level I1 to the second level I2 is defined as the timing or thereabout at which the gate voltage Vge has reached the predetermined Miller voltage Vm of the lower-arm switching element Q.

The second level I2 of the drive current Ige flowing to the gate of the switching element Q during the period from the time t31 to the time t32 can be set to be equal to or different from the second level I2 of the drive current Ige flowing to the gate of the switching element Q after the time t33.

That is, the second level I2 of the drive current Ige flowing to the gate of the switching element Q during the period from the time t31 to the time t32 can be set to be larger or smaller than the second level I2 of the drive current Ige flowing to the gate of the switching element Q after the time t33.

The following describes a third comparison example where the drive controller 70 maintains the drive current Ige at the first level I1 after the rising of the corresponding command signal at the time t31 (see a dashed-dot line in FIG. 5C). FIGS. 5A to 5E illustrate that the third comparison example may cause the gate voltage Vge to increase more gradually (see a dashed-dot line in FIG. 5B), and the collector-emitter voltage Vce to decrease more gradually (see a dashed-dot line indicated by the arrow X in FIG. 5E).

In contrast, controlling the drive current Ige in the third charging pattern accelerates an increase of the gate voltage Vge immediately after the start of charging the gate of the lower-arm switching element Q while accelerating a decrease of the collector-emitter voltage Vce. This enables both power loss due to the collector-emitter voltage Vce to be reduced and suitable dead times to be secured.

Next, the following describes first to third discharging patterns as examples of the second adjustment pattern for switching the switching element Q from the on state to the off state in accordance with the pattern information PI.

FIGS. 6A to 6E illustrates a joint timing chart schematically for describing the first discharging pattern, and FIGS. 6A to 6E illustrates a joint timing chart for describing the second discharging pattern of a lower-arm switching element Q that is a selected one of the lower-arm switching elements Q12, Q14, and Q16. The parameters illustrated in FIGS. 6A to 6E respectively correspond to the parameters illustrated in FIGS. 3A to 3E. The parameters illustrated in FIGS. 7A to 7E respectively correspond to the parameters illustrated in FIGS. 4A to 4E.

In FIGS. 6A to 6E, the drive controller 70 changes the drive current Ige, which flows from the gate of the switching element Q, to the first level I1 from zero in response to the falling of the corresponding command signal at time t41 so that the discharging of the gate of the switching element Q is started. The drive controller 70 maintains the drive current Ige at the first level I1. The drive controller 70 causes the drive current Ige to rise from the first level I1 to the second level I2 at time t43 when a predetermined third adjustment period TC has elapsed since the time t41. That is, the drive controller 70 changes the drive current Ige stepwisely from the time t41 to the time t43.

After the time t41, the gate voltage Vge decreases gradually down to the Miller voltage Vm, and thereafter, maintains at the Miller voltage Vm for the Miller period. After completion of the Miller period, the gate voltage Vge decreases gradually again. The collector-emitter current Ice starts to decrease when the gate voltage Vge has reached the threshold voltage Vth at time t42. The time t43 at which the gate voltage Vge is switched from the first level I1 to the second level I2 is defined as a point of time within the period during which the collector-emitter current Ice of the switching element Q, falls to zero. The length of the third adjustment period TC is defined based on the time t43. The collector-emitter current Ice corresponds to the current flowing between the input and output terminals of the switching element Q.

The following describes a fourth comparison example where the drive controller 70 maintains the drive current Ige at the first level I1 after the falling of the corresponding command signal at the time t41 (see a dashed-dot line in FIG. 6C). FIGS. 6A to 6E illustrate that the fourth comparison example may cause the collector-emitter current Ice to decrease more gradually during a tail time (see a dashed-dot line in FIG. 6E). That is, the fourth comparison example may result in the decrease of the collector-emitter current Ice slowing down during the tail time, resulting in the occurrence of power loss due to the more gradual decrease of the collector-emitter current Ice. In contrast, controlling the drive current Ige in the first discharging pattern illustrated in FIG. 6C increases the drive current Ige at the time t43 to speed up the decrease of the collector-emitter current Ice accordingly, thus reducing power loss due to the collector-emitter current Ice.

In FIGS. 7A to 7E, the drive controller 70 changes the drive current Ige, which flows from the gate of the lower-arm switching element Q, to the second level I2 from zero in response to the falling of the command signal for the lower-arm switching element Q at time t51. This results in the discharging of the gate of the lower-arm switching element Q being started at the time t51. The drive controller 70 maintains the drive current Ige at the second level I2. The drive controller 70 causes the drive current Ige to fall from the second level I2 to the first level I1 at time t52 when a predetermined fourth adjustment period TD has elapsed since the time t51. That is, the drive controller 70 changes the drive current Ige stepwisely from the time t51 to the time t52.

After the time t51, the gate voltage Vge decreases gradually, and thereafter, maintains at the Miller voltage Vm for the Miller period. After completion of the Miller period, the gate voltage Vge decreases gradually again. The time t52 at which the gate voltage Vge is switched from the second level I2 to the first level I1 is defined as the timing at which the gate voltage Vge has reached the threshold voltage Vth, which is slightly lower than the Miller voltage Vm of the lower-arm switching element Q. That is, the time t52 is defined as a point of time when the collector-emitter current Ice starts to fall, and the length of the fourth adjustment period TD is defined based on the time t52.

The following describes a fifth comparison example where the drive controller 70 maintains the drive current Ige at the first level I1 after the falling of the command signal for the lower-arm switching element Q at time t50 (see a dashed-dot line in FIG. 7C). FIGS. 7A to 7E illustrate that the fifth comparison example may make longer the time taken from the start of discharging the gate of the lower-arm switching element Q to the end of the Miller period. This may need to make faster the falling timing t50 of the command signal for the lower-arm switching element Q than the falling timing t51.

In contrast, controlling the drive current Ige in the second discharging pattern illustrated in FIG. 7C delays the falling timing t51 of the command signal for the lower-arm switching element Q relative to the falling liming t50 of the command signal for the lower-arm switching element Q according to the fifth comparative example if the timing at which the collector-emitter current Ice starts to decrease is set to be constant.

This results in efficient turn-on operations of the upper- and lower-arm switching elements Q while securing suitable dead times between the upper- and lower-arm switching elements Q. Reducing the drive current Ige from the second level I2 to the first level I1 at the time t52 prevents the occurrence of a surge during the decrease of the drive current Ice.

FIGS. 8A to 8E illustrates a joint timing chart schematically for describing the third discharging pattern, which is obtained by combination of the first and second discharging patterns, of a lower-arm switching element Q that is a selected one of the lower-arm switching elements Q12, Q14, and Q16.

In FIGS. 8A to 8E, the drive controller 70 changes the drive current Ige to the second level I2 from zero in response to the falling of the command signal for the lower-arm switching element Q at time t61 so that the discharging of the gate of the lower-arm switching element Q is started.

The drive controller 70 maintains the drive current Ige at the second level I2. The drive controller 70 causes the drive current Ige to fall from the second level I2 to the first level I1 at time t62 when the fourth adjustment period TD has elapsed since the time t61. That is, the drive controller 70 changes the drive current Ige stepwisely from the time t61 to the time t62.

After the time t61, the gate voltage Vge decreases gradually down to the Miller voltage Vm, and maintains at the Miller voltage Vm for the Miller period. After completion of the Miller period, the gate voltage Vge decreases gradually again to reach the threshold voltage Vth slightly lower than the Miller voltage Vm, so that the collector-emitter current Ice starts to decrease at time t62. At the time t62, the drive current Ige is switched from the second level I2 to the first level I1, and thereafter, the drive current Ige is switched from the first level I1 to the second level I2 at time t63 before the collector-emitter current Ice becomes zero. The drive controller 70 controls the time t63 based on the elapsed third adjustment period TC since the time t61, but can control the time t63 based on the elapsed time since the time t62.

The second level I2 of the drive current Ige flowing from the gate of the switching element Q during the period from the time t61 to the time t62 can be set to be equal to or different from the second level I2 of the drive current Ige flowing from the gate of the switching element Q after the time t63.

That is, the second level I2 of the drive current Ige flowing from the gate of the switching element Q during the period from the time t61 to the time t62 can be set to be larger or smaller than the second level I2 of the drive current Ige flowing from the gate of the switching element Q after the time t63.

The following describes a sixth comparison example where the drive controller 70 maintains the drive current Ige at the first level I1 after the falling of the corresponding command signal at the time t61 (see a dashed-dot line in FIG. 8C). FIGS. 8A to 8E illustrate that the sixth comparison example may lengthen the period from the time t60 to the time t62, that is, the period taken from the start of discharging the gate of the lower-arm switching element Q to the end of the Miller period. The sixth comparison example also may result in the decrease of the collector-emitter current Ice slowing down.

In contrast, controlling the drive current Ige in the third discharging pattern reduces the time taken from the start of discharging the gate of the lower-arm switching element Q to the end of the Miller period, and accelerates a decrease of the collector-emitter current Ice. This enables both power loss due to the collector-emitter voltage Vice to be reduced and suitable dead times to be secured.

The drive unit 25 for the upper-arm switching element Q1 preferably uses the first charging pattern as the first adjustment pattern, and the drive unit 25 for the lower-arm switching element Q2 preferably uses the first discharging pattern as the second adjustment pattern.

As described above, the drive unit 60 is configured to vary each of the on switching rate and the off switching rate according to the at least one rate adjustment parameter. This configuration results in change of the waveforms of the current and voltage parameters, such as the gate voltage Vge and the drive current Ige, illustrated in FIGS. 3A to 8E, depending on variation of the on switching rate or the off switching rate of the switching element Q. Specifically, this configuration causes the timings at which the drive current Ige should be changed to vary in each of the first to third charging patterns and the first to third discharging patterns.

In view of the above, when switching the switching element Q from the off state to the on state, the drive unit 60 of the switching element Q is configured to set the timings to change the drive current Ige between the first and second levels I1 and I2 according to at least one of (1) The on switching rate determined by the drive controller 70

(2) The at least one rate adjustment parameter used for the drive controller 70 to determine the on switching rate.

Specifically, the drive unit 60 of the switching element Q according to the embodiment sets the length of at least one of the first and second adjustment periods TA and TB in a corresponding one of the first, second, and third charging patterns according to at least one of (1) The on switching rate determined by the drive controller 70

(2) The at least one rate adjustment parameter used for the drive controller 70 to determine the on switching rate.

Figure 9:
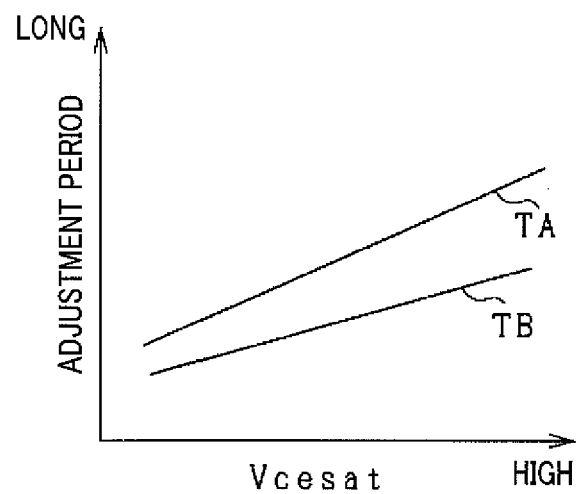
FIG. 9 is a graph schematically illustrating the correlations between the collector-emitter voltage of a switching element and each of first and second adjustment periods according to the embodiment.

For example, the memory 70b stores third map information M13. The third map information M13 represents the correlations between values of the collector-emitter voltage Vce of the switching element Q and corresponding values of each of the first and second adjustment periods TA and TB. FIG. 9 illustrates the correlations between the collector-emitter voltage Vce of the switching element Q and each of the first and second adjustment periods TA and TB in a two-dimensional graph format. The drive unit 60, i.e. the drive controller 70, extracts, from the memory 70b, a value of at least one of the first and second adjustment periods TA and TB; the extracted value of at least one of the adjustment periods TA and TB matches with the present value of the collector-emitter voltage Vce. This enables at least one of the first and second adjustment periods TA and TB used for one of the first to third charging patterns (see FIGS. 3 to 5) to be determined.

Figure 10:
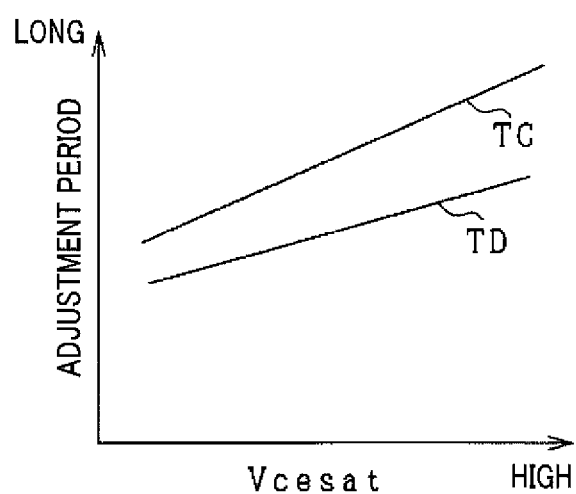
FIG. 10 is a graph schematically illustrating the correlations between the collector-emitter voltage of a switching element and each of third and fourth adjustment periods according to the embodiment.

Additionally, the memory 70b for example stores fourth map information M14. The fourth map information M14 represents the correlations between values of the collector-emitter voltage Vce of the switching element Q and corresponding values of each of the third and fourth adjustment periods TC and TD. FIG. 10 illustrates the correlations between the collector-emitter voltage Vce of the switching element Q and each of the third and fourth adjustment periods TC and TD in a two-dimensional graph format. The drive unit 60, i.e. the drive controller 70, extracts, from the memory 70b, a value of at least one of the third and fourth adjustment periods TC and TD; the extracted value of at least one of the third and fourth adjustment periods TC and TD matches with the present value of the collector-emitter voltage Vce. This enables at least one of the third and fourth adjustment periods TC and TD used for one of the first to third discharging patterns (see FIGS. 6 to 8) to be determined.

The drive controller 70 is capable of switching between one of the first to third charging patterns to another of the first to third charging patterns according to at least one of predetermined various conditions, such as operating conditions, of the vehicle when charging the switching element Q.

For example, sensors SS, which are illustrated by a phantom line in FIG. 1, can be provided for measuring the various operating conditions of the vehicle. The sensors SS include a rotational speed sensor, such as a resolver, configured to measure the rotational speed of the MG 11 and to output, to each of the drive units 25 and 60, a measurement signal indicative of the rotational speed of the MG 11 or the frequency of the AC voltage applied to the MG 11. Specifically, the drive controller 70 of each of the drive units 25 and 60 can be configured to switch between the first charging pattern and the second charging pattern according to change of the rotational speed of the MG 11 or change of the frequency of the AC voltage applied to the MG 11.

Similarly, the drive controller 70 is capable of switching between one of the first to third discharging patterns according to at least one of the predetermined various conditions, such as operating conditions, of the vehicle when discharging the switching element Q.

Specifically, the drive controller 70 of each of the drive units 25 and 60 can be configured to switch between the first discharging pattern and the second discharging pattern according to change of the rotational speed of the MG 11 or change of the frequency of the AC voltage applied to the MG 11.

For example, the drive controller 70 of each of the drive units 25 and 60 can include a hardware logic circuit HC1 that periodically performs the following pattern switching routine. Alternatively, the drive controller 70 of each of the drive units 25 and 60 can serve as a software logic circuit to periodically run one or more programs, i.e. the set of instructions, stored in the memory 70b to periodically perform the following pattern switching routine accordingly. The control device 50 can include a hardware logic circuit that periodically performs the following pattern switching routine, or periodically run one or more programs to periodically perform the following pattern switching routine accordingly. The following describes the drive controller 70 of each of the drive units 25 and 60 periodically performs the pattern switching routine as an example.

Figure 11:
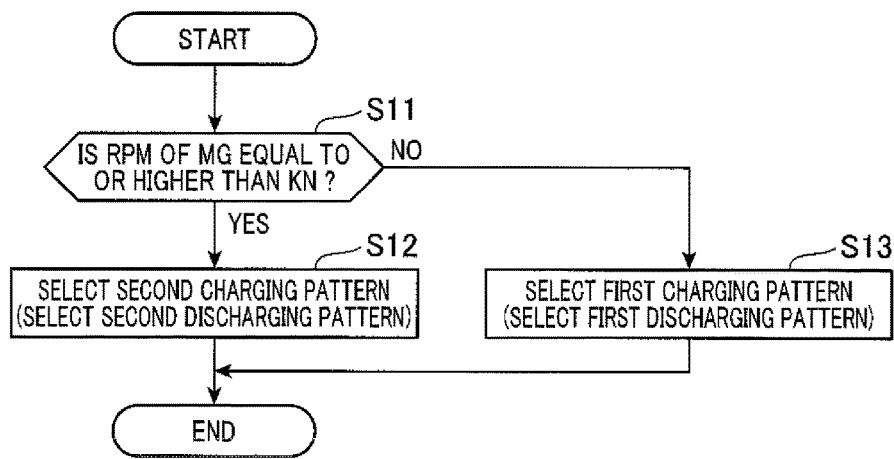
FIG. 11 is a flowchart schematically illustrating an example of a pattern switching routine carried out by a drive controller of each drive unit according to the embodiment.

When starting the pattern switching routine for switching the switching element Q from the off state to the on state, the drive controller 70 serves as, for example, a determining unit to determine whether the rotational speed (see RPM in FIG. 11) of the MG 11 is equal to or higher than a predetermined value, i.e. a threshold value, KN in step S11 of FIG. 11. Upon determining that the rotational speed of the MG 11 is equal to or higher than the predetermined value KN (YES in step S11), the drive controller 70 serves as, for example, a selecting unit to select the second charging pattern to perform adjustment of the drive current Ige in accordance with the second charging pattern in step S12. Otherwise, upon determining that the rotational speed of the MG 11 is lower than the predetermined value KN (NO in step S11), the drive controller 70 serves as, for example, a selecting unit to select the first charging pattern to perform adjustment of the drive current Ige in accordance with the first charging pattern in step S13.

In step S11, the drive controller 70 can determine whether the frequency of the AC voltage applied to the MG 11 is equal to or higher than a predetermined frequency corresponding to the predetermined value KN.

Similarly, when determining that the rotational speed of the MG 11 is equal to or higher than the predetermined value KN for switching the switching element Q from the on state to the off state (YES in step S11), the drive controller 70 selects the second discharging pattern to perform adjustment of the drive current Ige in accordance with the second discharging pattern in step S12. Otherwise, when determining that the rotational speed of the MG 11 is lower than the predetermined value KN (NO in step S11), the drive controller 70 selects the first discharging pattern to perform adjustment of the drive current Ige in accordance with the first discharging pattern in step S13.

Additionally, when switching the switching element Q from the off state to the on state, the drive controller 70 of each of the drive units 25 and 60 can be configured to, according to, for example, the collector-emitter voltage Vice of the switching element Q and/or the power supply voltage, i.e. the system voltage, Vdc for the inverter 30, select one of (1) Adjusting the drive current Ige in accordance with a selected one of the first to third charging patterns (2) Holding the drive current Ige unchanged.

Specifically, the drive controller 70 of each of the drive units 25 and 60 can include a hardware logic circuit HC2 that periodically performs the following current adjustment routine. Alternatively, the drive controller 70 of each of the drive units 25 and 60 can serve as a software logic circuit to periodically run one or more programs, i.e. the set of instructions, stored in the memory 70b to periodically perform the following current adjustment routine accordingly. The control device 50 can include a hardware logic circuit that periodically performs the following current adjustment routine, or periodically run one or more programs to periodically perform the following current adjustment routine accordingly. The following describes the drive controller 70 of each of the drive units 25 and 60 periodically performs the current adjust routine as an example.

Figure 12:
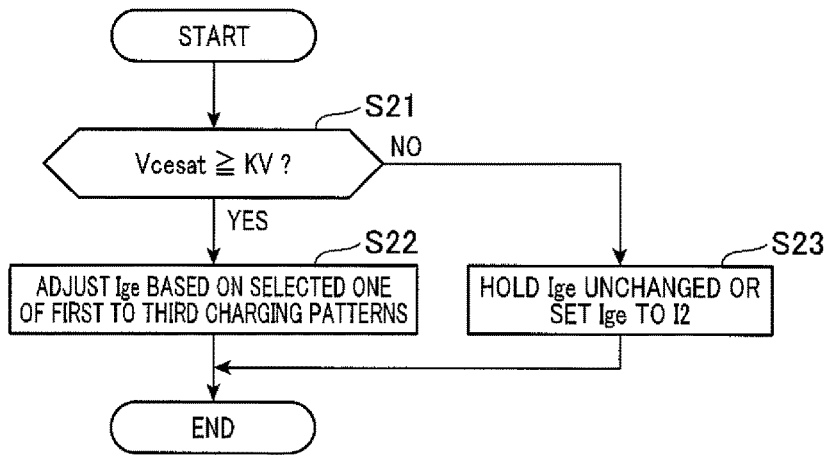
FIG. 12 is a flowchart schematically illustrating an example of a current adjustment routine carried out by the drive controller of each drive unit according to the embodiment.

When starting the current adjustment routine for switching the switching element Q from the off state to the on state, the drive controller 70 serves as, for example, a determining unit to determine whether a present value of the collector-emitter voltage Vce is equal to or higher than a predetermined value KV in step S21 of FIG. 12. Upon determining that the present value of the collector-emitter voltage Vce is equal to or higher than the predetermined value KV (YES in step S21), the drive controller 70 selects adjusting the drive current Ige in accordance with a selected one of the first to third charging patterns in step S22.

Otherwise, upon determining that the present value of the collector-emitter voltage Vce is lower than the predetermined value KV (NO in step S21), the drive controller 70 selects holding the drive current Ige unchanged or setting the drive current Ige to the second level I2 in step S23.

Similarly, when starting the current adjustment routine for switching the switching element Q from the on state to the off state, the drive controller 70 determines whether a present value of the collector-emitter voltage Vce is equal to or higher than the predetermined value KV (see step S21 of FIG. 12). Upon determining that the present value of the collector-emitter voltage Vce is equal to or higher than the predetermined value KV (YES in step S21), the drive controller 70 selects adjusting the drive current Ige in accordance with a selected one of the first to third discharging patterns in step S22.

Otherwise, upon determining that the present value of the collector-emitter voltage Vce is lower than the predetermined value KV (NO in step S21), the drive controller 70 selects holding the drive current Ige unchanged or setting the drive current Ige to the second level I2 in step S23.

As described above, each of the drive units 20 and 65 according to the embodiment adjusts at least one of (1) The drive current Ige flowing to the gate of the corresponding switching element Q via the charging resistor 62 when switching the switching element Q from the off state to the on state (2) The drive current Ige flowing from the gate of the corresponding switching element Q via the discharging resistor 67 when switching the switching element Q from the on state to the off state.

This adjustment enables the rate of switching the switching element Q from one of the on state and the off state to the other thereof to be adjusted to a desired rate. Specifically, the current adjuster 71 of each of the drive units 20 and 65 adjusts the charging current Ige flowing through the charging resistor 63 while keeping the charging switching element 63 on and the discharging switching element 66 off. Additionally, the current adjuster 71 of each of the drive units 20 and 65 adjusts the discharging current Ige flowing through the discharging resistor 67 while keeping the discharging switching element 66 on and the charging switching element 63 off.

That is, each of the drive units 25 and 60 according to the embodiment varies, i.e. adjusts, the rate of switching the switching element Q from one of the on state and the off state to the other thereof without using a plurality of current paths having different resistance values from each other, and a plurality of path switching elements for selecting one of the plurality of current paths. This simplifies the structure of each of the drive units 25 and 60, thus enabling the rate of switching the switching element Q from one of the on state and the off state to the other thereof to be variably set while each of the drive units 25 and 60 has a lower size.

The current adjuster 71 of each of the drive units 25 and 60 according to the embodiment changes, i.e. adjusts, the drive current Ige for charging the gate of the switching element Q according to change of the output voltage from the first DC power source 65. Similarly, the current adjuster 71 of each of the drive units 25 and 60 according to the embodiment changes, i.e. adjusts, the drive current Ige for discharging the gate of the switching element Q according to change of the output voltage from the second DC power source 69. Although each of the drive units 25 and 60 includes the power sources 65 and 69 and the operational amplifiers 64 and 68 for adjusting the drive current Ige, the components 65, 69, 64, and 68 are designed as low-current operation components. The low-current operation components differ in size from a plurality of current paths having different resistance values from each other disclosed in the patent document 1. This therefore enables each of the drive units 25 and 60 to have a smaller size.

The drive controller 70 of each of the drive units 25 and 60 is configured to adjust, in accordance with the first charging pattern, the drive current Ige to (1) Set the drive current Ige to the first level I1, when starting charging of the gate of the switching element Q (2) Change the drive current Ige from the first level I1 to the second level I2, which is higher than the first level I1, at a point of time within the period during which the collector-emitter voltage Vce falls to zero.

This configuration speeds up the decrease of the collector-emitter voltage Vce, thus reducing power loss during the turn-on operation of the switching element Q.

The drive controller 70 of each of the drive units 25 and 60 is configured to adjust, in accordance with the second charging pattern, the drive current Ige to (1) Set the drive current Ige to the second level I2 when starting charging of the gate of the switching element Q (2) Change the drive current Ige from the second level I2 to the first level I1 at a point of time when the collector-emitter current Ice starts to flow.

This configuration increases the switching responsivity of the switching element Q from the off state to the on state in response to the rising of the command signal for the switching element Q. This results in efficient turn-on operations of the switching element Q while securing suitable dead times.

The drive controller 70 of each of the drive units 25 and 60 is configured to adjust, in accordance with the combination of the first and second charging patterns as the third charging pattern, the drive current Ige. This configuration results in both reduction of power loss during the turn-on operation of the switching element Q and efficient turn-on operations of the switching element Q while securing suitable dead times.

The drive controller 70 of each of the drive units 25 and 60 is configured to adjust, in accordance with the first discharging pattern, the drive current Ige to (1) Set the drive current Ige to the first level I1 when start discharging of the gate of the switching element Q (2) Change the drive current Ige from the first level I1 to the second level I2, which is higher than the first level I1, at a point of time within the period during which the collector-emitter current Ice falls to zero.

This configuration speeds up the decrease of the collector-emitter current Ice immediately before the switching element Q is switched from the on state to the off state, thus reducing power loss during the turn-off operation of the switching element Q.

The drive controller 70 of each of the drive units 25 and 60 is configured to adjust, in accordance with the second discharging pattern, the drive current Ige to (1) Set the drive current Ige to the second level I2 when starting discharging of the gate of the switching element Q (2) Change the drive current Ige from the second level I2 to the first level I1 at a point of time when the collector-emitter current Ice starts to fall.

This configuration delays the falling timing of the command signal for the switching element Q. This results in efficient turn-off operations of the switching element Q while securing suitable dead times.

The drive controller 70 of each of the drive units 25 and 60 is configured to adjust, in accordance with the combination of the first and second discharging patterns as the third discharging pattern, the drive current Ige. This configuration results in both reduction of power loss during the turn-off operation of the switching element Q and efficient turn-off operations of the switching element Q while securing suitable dead times.

The drive controller 70 of each of the drive units 25 and 60 is configured to (1) determine whether the rotational speed of the MG 11 is equal to or higher than the predetermined value KN, i.e., whether the frequency of the AC voltage applied to the MG 11 is equal to or higher than the predetermined frequency corresponding to the predetermined value KN (2) Change the drive current Ige in the second charging pattern when it is determined that the rotational speed of the MG 11 is equal to or higher than the predetermined value KN, i.e., the frequency of the AC voltage applied to the MG 11 is equal to or higher than the predetermined frequency (3) Change the drive current Ige in the first charging pattern when it is determined that the rotational speed of the MG 11 is lower than the predetermined value KN, i.e., the frequency of the AC voltage applied to the MG 11 is lower than the predetermined frequency.

This configuration gives higher priority to both efficient turn-on operations of the switching element Q and securing of suitable dead times than reduction of power loss when it is determined that the MG 11 is rotating at a higher speed than the predetermined value KN. In contrast, this configuration gives higher priority to reduction of power loss than both efficient turn-on operations of the switching element Q and securing of suitable dead times when it is determined that the MG 11 is rotating at a lower speed than the predetermined value KN.

The drive controller 70 of each of the drive units 25 and 60 is configured to (1) determine whether the rotational speed of the MG 11 is equal to or higher than the predetermined value KN, i.e., whether the frequency of the AC voltage applied to the MG 11 is equal to or higher than the predetermined frequency corresponding to the predetermined value KN (2) Change the drive current Ige in the second discharging pattern when it is determined that the rotational speed of the MG 11 is equal to or higher than the predetermined value KN, i.e., the frequency of the AC voltage applied to the MG 11 is equal to or higher than the predetermined frequency (3) Change the drive current Ige in the first discharging pattern when it is determined that the rotational speed of the MG 11 is lower than the predetermined value KN, i.e., the frequency of the AC voltage applied to the MG 11 is lower than the predetermined frequency.

This configuration gives higher priority to both efficient turn-on operations of the switching element Q and securing of suitable dead times than reduction of power loss when it is determined that the MG 11 is rotating at a higher speed than the predetermined value KN. In contrast, this configuration gives higher priority to reduction of power loss than both efficient turn-on operations of the switching element Q and securing of suitable dead times when it is determined that the MG 11 is rotating at a lower speed than the predetermined value KN.

The drive controller 70 of each drive unit is configured to determine whether to switch the charging current Ige from one of the first and second levels I1 and I2 to the other thereof according to change of the on switching rate determined thereby and/or the rate adjustment parameter used for determining the on switching rate.

This configuration enables the charging current Ige to be switched from one of the first level I1 and the second level I2 to the other thereof at timings each determined to be suitable for a corresponding one of the adjusted values of the on switching rate. This therefore results in turn-on operations of the switching element Q determined to be suitable for the adjusted values of the on switching rate.

The drive controller 70 of each drive unit is configured to determine whether to switch the discharging current Ige from one of the first level I1 and the second level I2 to the other thereof according to change of the on switching rate determined thereby and/or the rate adjustment parameter used for determining the on switching rate.

This configuration enables the discharging current Ige to be switched from one of the first level I1 and the second level I2 to the other thereof at timings each determined to be suitable for a corresponding one of the adjusted values of the off switching rate. This therefore results in turn-off operations of the switching element Q determined to be suitable for the adjusted values of the off switching rate.

The drive controller 70 of each drive unit is configured to (1) Determine whether the collector-emitter voltage Vce of the switching element Q is equal to or higher than the predetermined value KV for at least one of turn-on and turn-off of the switching element Q (2) Switch the drive current Ige between the first level I1 and the second level I2 when it is determined that the collector-emitter voltage Vce of the switching element Q is equal to or higher than the predetermined value KV (3) Maintain the drive current Ige to the second level I2 when it is determined that the collector-emitter voltage Vce of the switching element Q is lower than the predetermined value KV.

This configuration results in both reduction of power loss during the turn-off operation of the switching element Q and securing of suitable dead times when the power supply voltage Vdc, which correlates with the collector-emitter voltage Vce, has a higher value than the predetermined value KV.

The present disclosure is not limited to the aforementioned embodiment, and can be modified within the scope thereof.

The drive controller 70 of each drive unit according to the embodiment can change, in a modified first charging pattern, the drive current Ige from the first level I1 to the second level I2 according to change of the collector-emitter voltage Vce obtained based on the measurement signal output from the voltage sensor 23. Specifically, the drive controller 70 of each drive unit can be configured to change, in the modified first charging pattern, the drive current Ige from the first level I1 to the second level I2 at a point of time when the collector-emitter voltage Vce has reached a predetermined value within the period during which the collector-emitter voltage Vce falls to zero.

The drive controller 70 of each drive unit according to the embodiment can change, in a modified second charging pattern, the drive current Ige from the second level I2 to the first level I1 according to change of the collector-emitter current Ice obtained based on the measurement signal output from the current sensor 31. Specifically, the drive controller 70 of each drive unit can be configured to change, in the modified second charging pattern, the drive current Ige from the second level I2 to the first level I1 at a point of time when the collector-emitter current Ice starts to flow.

The drive controller 70 of each drive unit according to the embodiment can change the drive current Ige in the combination of the modified first charging pattern and the modified second charging pattern as a modified third charging pattern.

The drive controller 70 of each drive unit according to the embodiment can change, in a modified first discharging pattern, the drive current Ige from the first level I1 to the second level I2 according to change of the collector-emitter current Ice obtained based on the measurement signal output from the current sensor 31. Specifically, the drive controller 70 of each drive unit can be configured to change, in the modified first discharging pattern, the drive current Ige from the first level I1 to the second level I2 at a point of time the collector-emitter current Ice has reached a predetermined value within the period during which the collector-emitter current Ice falls to zero.

The drive controller 70 of each drive unit according to the embodiment can change, in a modified second discharging pattern, the drive current Ige from the second level I2 to the first level I1 according to change of the collector-emitter current Ice obtained based on the measurement signal output from the current sensor 31. Specifically, the drive controller 70 of each drive unit can be configured to change, in the modified second discharging pattern, the drive current Ige from the second level I2 to the first level I1 at a point of time when the collector-emitter current Ice starts to fall.

The drive controller 70 of each drive unit according to the embodiment can change the drive current Ige in the combination of the modified first discharging pattern and the modified second discharging pattern as a modified third discharging pattern.

As described above, the hardware logic circuit HC1 or the corresponding software logic circuit for adjusting the drive current Ige for switching the switching element Q from the off state to the on state can be installed in the control device 50. Similarly, the hardware logic circuit HC2 or the corresponding software logic circuit for adjusting the drive current Ige for switching the switching element Q from the on state to the off state can be installed in the control device 50.

The control device 50 according to this modification can be configured to
(1) Change the drive current Ige in one of the first to third charging patterns according to a corresponding predetermined period that has elapsed since the rising of the command signal or the rate adjustment parameter Vce or Ice
(2) Change the drive current Ige in one of the first to third discharging patterns according to a corresponding predetermined period that has elapsed since the falling of the command signal or the rate adjustment parameter Vce or Ice.

The control device 50 according to this modification can also be configured to
(1) Change the drive current Ige in one of the first to third discharging patterns according to a corresponding predetermined period that has elapsed since the falling of the command signal or the rate adjustment parameter Vce or Ice
(2) Change the drive current Ige according to one of the first to third discharging patterns according to a corresponding predetermined period that has elapsed since the falling of the command signal or the rate adjustment parameter Vce or Ice.

Each of the drive units 25 and 60 can be configured to variably set one of the on switching rate and the off switching rate of the switching element Q. In this modification, each of the drive units 25 and 60 can be configured to perform adjustment of the drive current Ige when performing the corresponding one of the turn-on operation and the turn-off operation of the switching the switching element Q While the illustrative embodiment and its modifications of the present disclosure have been described herein, the present disclosure is not limited to the embodiment and its modifications described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:
1. A driving device for turning on or off, in response to a command signal, a switching element having an input terminal, an output terminal, and an on-off control terminal, the driving device comprising:
a resistor provided on a current path connected to the on-off control terminal of the switching element, the current path permitting a drive current to flow therethrough to or from the on-off control terminal of the switching element;
a switching rate setter configured to set a switching rate of switching the switching element from one of an on state and an off state to the other thereof; and
a current adjusting means connected to a predetermined terminal provided on the current path, the current adjusting means comprising an open-close control element provided on the current path for electrically opening or closing the current path, the current adjusting means being configured to adjust, according to the switching rate set by the switching rate setter, a voltage applied to the predetermined terminal to thereby change the drive current having a variable non-zero value and flowing through the current path and the resistor while closing the open-close control element.

2. The driving device according to claim 1, wherein the current adjusting means comprises a voltage output unit configured to generate a variable output voltage as the output voltage applied to the predetermined terminal,
the current adjusting means being configured to adjust, according to the switching rate set by the switching rate setter, the output voltage to thereby change the drive current flowing to or from the on-off control terminal of the switching element via the current path.

3. The driving device according to claim 1, wherein the current adjusting means is capable of switching the drive current between a first level and a second level higher than the first level,
the current adjusting means being configured to:
set the drive current to the first level to start charging of the on-off control terminal of the switching element when switching the switching element from the off state to the on state; and
change the drive current from the first level to the second level at a point of time within a period during which a voltage between the input terminal and the output terminal falls to zero after the start of charging the on-off control terminal of the switching element.

4. The driving device according to claim 1, wherein the current adjusting means is capable of switching the drive current between a first level and a second level higher than the first level,
the current adjusting means being configured to:
set the drive current to the second level to start charging of the on-off control terminal of the switching element when switching the switching element from the off state to the on state; and
change the drive current from the second level to the first level at a point of time when a current starts to flow between the input terminal and the output terminal.

5. The driving device according to claim 1, wherein the current adjusting means is capable of switching the drive current between a first level and a second level higher than the first level,
the current adjusting means being configured to:
set the drive current to the second level to start charging of the on-off control terminal of the switching element when switching the switching element from the off state to the on state;
change the drive current from the second level to the first level at a point of time when a current starts to flow between the input terminal and the output terminal; and
change the drive current from the first level to the second level at a point of time within a period during which a voltage between the input terminal and the output terminal falls to zero.

6. The driving device according to claim 1, wherein the switching element is connected between a power source and a rotary machine such that on and off operations of the switching element adjust power output from the power source to be supplied to the rotary machine for rotatably driving the rotary machine, and the current adjusting means is capable of switching the drive current between a first level and a second level higher than the first level,
the current adjusting means being configured to:
perform a first on-switching operation that:
sets the drive current to the first level to start charging of the on-off control terminal of the switching element when switching the switching element from the off state to the on state;
changes the drive current from the first level to the second level at a point of time within a period during which a voltage between the input terminal and the output terminal falls to zero after the start of charging the on-off control terminal of the switching element; and
perform a second on-switching operation that:
sets the drive current to the second level to start charging of the on-off control terminal of the switching element when switching the switching element from the off state to the on state; and
changes the drive current from the second level to the first level at a point of time when a current starts to flow between the input terminal and the output terminal,
the driving device further comprising:
a determining unit configured to determine whether a parameter associated with a rotational speed of the rotary machine is equal to or higher than a predetermined value; and
a selecting unit configured to:
select the second on-switching operation to cause the current adjusting means to perform the second on-switching operation when it is determined that the rotational speed of the rotary machine is equal to or higher than the predetermined value, and
select the first on-switching operation to cause the current adjusting means to perform the first on-switching operation when it is determined that the rotational speed of the rotary machine is lower than the predetermined value.

7. The driving device according to claim 3, wherein:
the switching rate setter is configured to set the switching rate of switching the switching element from one of the on state and the off state to the other thereof according to a predetermined rate adjustment parameter, the rate adjustment parameter correlating with an operating characteristic of the switching element; and
the current adjusting means is configured to set a timing to change the drive current between the first level and the second level according to at least one of the switching rate set by the switching rate setter and the rate adjustment parameter after the start of charging the on-off control terminal of the switching element.

8. The driving device according to claim 4, wherein:
the switching rate setter is configured to set the switching rate of switching the switching element from one of the on state and the off state to the other thereof according to a predetermined rate adjustment parameter, the rate adjustment parameter correlating with an operating characteristic of the switching element; and
the current adjusting means is configured to set a timing to change the drive current between the first level and the second level according to at least one of the switching rate set by the switching rate setter and the rate adjustment parameter after the start of charging the on-off control terminal of the switching element.

9. The driving device according to claim 1, wherein the current adjusting means is capable of switching the drive current between a first level and a second level higher than the first level,
the current adjusting means being configured to:
set the drive current to the first level to start discharging of the on-off control terminal of the switching element when switching the switching element from the on state to the off state; and change the drive current from the first level to the second level at a point of time within a period during which a current flowing between the input terminal and the output terminal falls to zero after the start of discharging the on-off control terminal of the switching element.

10. The driving device according to claim 1, wherein the current adjusting means is capable of switching the drive current between a first level and a second level higher than the first level, the current adjusting means being configured to:

set the drive current to the second level to start discharging of the on-off control terminal of the switching element when switching the switching element from the on state to the off state; and change the drive current from the second level to the first level at a point of time when a current flowing between the input terminal and the output terminal starts to decrease after the start of discharging the on-off control terminal of the switching element.

11. The driving device according to claim 1, wherein the current adjusting means is capable of switching the drive current between a first level and a second level higher than the first level, the current adjusting means being configured to:

set the drive current to the second level to start discharging of the on-off control terminal of the switching element when switching the switching element from the on state to the off state;

change the drive current from the second level to the first level at a point of time when a current flowing between the input terminal and the output terminal starts to decrease; and change the drive current from the first level to the second level at a point of time within a period during which the current flowing between the input terminal and the output terminal falls to zero.

12. The driving device according to claim 1, wherein the switching element is connected between a power source and a rotary machine such that on and off operations of the switching element adjust power output from the power source to be supplied to the rotary machine for rotatably driving the rotary machine, and the current adjusting means is capable of switching the drive current between a first level and a second level higher than the first level, the current adjusting means being configured to:

perform a first off-switching operation that:

sets the drive current to the first level to start discharging of the on-off control terminal of the switching element when switching the switching element from the on state to the off state; and changes the drive current from the first level to the second level at a point of time within a period during which a current flowing between the input terminal and the output terminal falls to zero after the start of discharging the on-off control terminal of the switching element; and perform a second off-switching operation that:

sets the drive current to the second level to start discharging of the on-off control terminal of the switching element when switching the switching element from the on state to the off state; and changes the drive current from the second level to the first level at a point of time when a current flowing between the input terminal and the output terminal starts to decrease after the start of discharging the on-off control terminal of the switching element, the driving device further comprising:

a determining unit configured to determine whether a parameter associated with a rotational speed of the rotary machine is equal to or higher than a predetermined value; and a selecting unit configured to:

select the second off-switching operation to cause the current adjusting means to perform the second off-switching operation when it is determined that the rotational speed of the rotary machine is equal to or higher than the predetermined value, and select the first off-switching operation to cause the current adjusting means to perform the first off-switching operation when it is determined that the rotational speed of the rotary machine is lower than the predetermined value.

13. The driving device according to claim 9, wherein:

the switching rate setter is configured to set the switching rate of switching the switching element from one of the on state and the off state to the other thereof according to a predetermined rate adjustment parameter, the rate adjustment parameter correlating with an operating characteristic of the switching element; and the current adjusting means is configured to set a timing to change the drive current between the first level and the second level according to at least one of the switching rate set by the switching rate setter and the rate adjustment parameter after the start of discharging the on-off control terminal of the switching element.

14. The driving device according to claim 10, wherein:

the switching rate setter is configured to set the switching rate of switching the switching element from one of the on state and the off state to the other thereof according to a predetermined rate adjustment parameter, the rate adjustment parameter correlating with an operating characteristic of the switching element; and the current adjusting means is configured to set, after the start of discharging the on-off control terminal of the switching element, a timing to change the drive current between the first level and the second level according to at least one of the switching rate set by the switching rate setter and the rate adjustment parameter.

15. The driving device according to claim 1, wherein the switching element is configured such that a voltage is applied across the input terminal and the output terminal thereof, and the current adjusting means is capable of switching the drive current between a first level and a second level higher than the first level, the driving device further comprising:

a determining unit configured to determine whether the voltage applied across the input terminal and the output terminal of the switching element is equal to or higher than a predetermined value, the current adjusting means being configured to:

switch the drive current between the first level and the second level when it is determined that the voltage applied across the input terminal and the output terminal of the switching element is equal to or higher than the predetermined value; and set the drive current to the second level when it is determined that the voltage applied across the input terminal and the output terminal of the switching element is lower than the predetermined value.

16. A power conversion system for converting input power into output power, the power converter comprising:
an upper-arm switching element having an input terminal, an output terminal, and an on-off control terminal,
a lower-arm switching element having an input terminal, an output terminal, and an on-off control terminal and connected in series to the upper-arm switching element, and
drive units provided for the respective upper- and lower-arm switching elements, each of the drive units being configured to turn on or off, in response to a command signal, a corresponding one of the upper- and lower-arm switching elements, each of the drive units comprising:
a resistor provided on a current path connected to the on-off control terminal of a corresponding one of the upper- and lower-arm switching elements, the current path permitting a drive current to flow therethrough to or from the on-off control terminal of a corresponding one of the upper- and lower-arm switching elements;
a switching rate setter configured to set a switching rate of switching a corresponding one of the upper- and lower-arm switching elements from one of an on state and an off state to the other thereof; and
a current adjusting means connected to a predetermined terminal provided on the current path, the current adjusting means comprising an open-close control element provided on the current path for electrically opening or closing the current path, the current adjusting means being configured to adjust, according to the switching rate set by the switching rate setter, a voltage applied to the predetermined terminal to thereby change the drive current having a variable non-zero value and flowing through the current path and the resistor while closing the open-close control element.

* * * * *